United States Patent
Sakaguchi

(10) Patent No.: US 7,253,752 B2
(45) Date of Patent: Aug. 7, 2007

(54) CODING APPARATUS, DECODING APPARATUS, CODING METHOD, DECODING METHOD AND PROGRAM

(75) Inventor: Hiroaki Sakaguchi, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/279,526

(22) Filed: Apr. 12, 2006

(65) Prior Publication Data

US 2007/0146173 A1   Jun. 28, 2007

(30) Foreign Application Priority Data

Apr. 14, 2005   (JP) .............................. 2005-117604

(51) Int. Cl.
*H03M 7/34* (2006.01)
(52) U.S. Cl. .......................................... 341/51; 341/55
(58) Field of Classification Search ................... 341/51, 341/106, 95, 87, 50, 67, 55; 707/7
See application file for complete search history.

(56) References Cited

U.S. PATENT DOCUMENTS 5,652,878 A * 7/1997 Craft ............................ 707/1
2004/0160983 A1 * 8/2004 Kuskin et al. ............... 370/471
2005/0283355 A1 * 12/2005 Itani et al. ..................... 704/1

* cited by examiner

*Primary Examiner*—Brian Young
(74) *Attorney, Agent, or Firm*—Bell, Boyd & Lloyd LLP

(57) ABSTRACT

An encoding and decoding apparatus is provided. In a coding process, a relation between a matching length and a matching-length code is dynamically changed in order to independently switch the matching length that can be expressed by the matching-length code from one value to another. By using a slide window in a data buffer as a dictionary, a character-string searching section searches for a state of matching a character sub-string in input data. A matching-length extension table is used for storing relations between matching lengths and matching-length codes as relations dependent on an internal state stored in an internal-state holding section. A matching-length coding section refers to the matching-length extension table in order to dynamically determine a relation between a matching length and a matching-length code as a relation dependent on an internal state. A character-string coding section generates a code string based on a relative position of a matching character sub-string in the slide window and a matching-length code associated with the matching length of the matching sub-string of characters.

11 Claims, 35 Drawing Sheets

FIG. 4A

| MATCHING LENGTH CODE c | MATCHING LENGTH len |
|---|---|
| 0 (0000) | 3 |
| 1 (0001) | 4 |
| 2 (0010) | 5 |
| 3 (0011) | 6 |
| 4 (0100) | 7 |
| 5 (0101) | 8 |
| 6 (0110) | 9 |
| 7 (0111) | 10 |
| 8 (1000) | 11 |
| 9 (1001) | 12 |
| 10 (1010) | 13 |
| 11 (1011) | 14 |
| 12 (1100) | 15 |
| 13 (1101) | 16 |
| 14 (1110) | L(14)[state]+1 |
| 15 (1111) | L(15)[state]+1 |

Rows 0–13: c+PTH+1

FIG. 4B

| INTERNAL STATE | 0 | 1 | 2 | 3 |
|---|---|---|---|---|
| L(14)[state] | 18 | 49 | 210 | 460 |
| L(15)[state] | 27 | 105 | 448 | 1791 |

| CODE(code) | | COMPRESSION RATES OF CHARACTER SUB-STRING | |
|---|---|---|---|
| | | M=8, PTH=2 | M=16, PTH=1 |
| RAW | | 112.50% | 106.25% |
| PTR | 0 | 70.83% | 53.13% |
| | 1 | 53.13% | 35.42% |
| | 2 | 42.50% | 26.56% |
| | 3 | 35.42% | 21.25% |
| | 4 | 30.36% | 17.71% |
| | 5 | 26.56% | 15.18% |
| | 6 | 23.61% | 13.28% |
| | 7 | 21.25% | 11.81% |
| | 8 | 19.32% | 10.63% |
| | 9 | 17.71% | 9.66% |
| | 10 | 16.35% | 8.85% |
| | 11 | 15.18% | 8.17% |
| | 12 | 14.17% | 7.59% |
| | 13 | 13.28% | 7.08% |
| | 14 | 12.50% | 6.64% |
| | 15 | 11.81% | 6.25% |
| | 18 | 10.12% | 5.31% |
| | 27 | 7.08% | 3.66% |
| | 49 | 4.09% | 2.08% |
| | 105 | 1.97% | 0.99% |
| | 210 | 1.00% | 0.50% |
| | 448 | 0.47% | 0.24% |
| | 460 | 0.46% | 0.23% |
| | 1791 | 0.12% | 0.06% |

(MATCHING LENGTH - PTH - 1)

F I G . 4 1
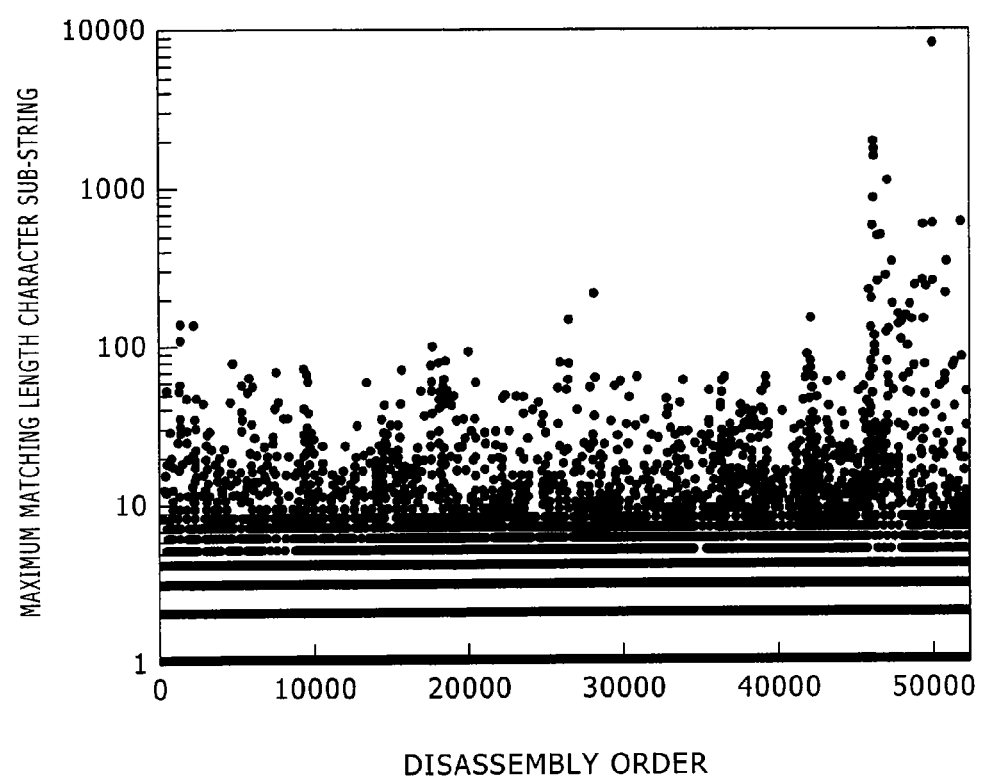
DISASSEMBLY ORDER

FLG : 0 → PTR { RELATIVE POSITION : 4
MATCHING LENGTH : 3

FLG : 1 → RAW : 'k'

CODING APPARATUS, DECODING APPARATUS, CODING METHOD, DECODING METHOD AND PROGRAM

CROSS REFERENCES TO RELATED APPLICATIONS

The present application claims priority to Japanese Patent Application JP 2005-117604 filed in the Japanese Patent Office on Apr. 14, 2005, the entire contents of which being incorporated herein by reference.

BACKGROUND

The present application relates to a coding apparatus and a decoding apparatus, which are based on LZSS (Lempel-Ziv-Storer-Szymanski) codes. More particularly, the present application relates to a coding apparatus and a decoding apparatus, which dynamically change a relation between a matching length in a coding process and its code, and relates to a coding method adopted by the coding apparatus, a decoding method adopted by the decoding apparatus and a program which make a computer execute the coding method and decoding method.

The LZSS code is one of codes for a coding process based on a dictionary. The coding process based on LZSS codes includes a reversible data compression process as disclosed in "Introduction to Algorithms for Compressing Text Data" authored by Tomohiko Uematsu and published by CQ Publishing on Oct. 15, 1994, pp. 131 to 138. In a coding process based on LZSS codes, input data to be coded is delimited into symbols each having a fixed length of M bits. An example of such a symbol is a character. As a matter of fact, such a symbol is explained uniformly as a character in the following description. Thus, a character is taken as the smallest unit. Data is perceived as a long string of characters. A portion included in the string of characters as a sequence of characters is handled as a sub-string of characters. The entire string of characters is disassembled into a plurality of character sub-strings and a CODE code is assigned to each of the character sub-strings. There are two types of CODE code assigned to each sub-string of characters. One of the types of code is a PTR code obtained as a result of a coding process carried out by referencing a matching sub-string of characters in already coded data Qenc. The other type of code is a RAW code, which is the original character itself. In addition, a FLG sub-code having a length of 1 bit is provided as a flag for indicating whether the code type is PTR or RAW. The FLG sub-code and the CODE code form a pair of codes. This pair of codes is the code obtained as a result of a process to code a sub-string of characters.

The lengths of character sub-strings are confirmed sequentially starting with the first character of the input data in order to gradually carry forward a disassembly process to separate the sub-strings of characters from each other. The character sub-strings obtained as a result of a disassembly process do not include overlapping portions. The disassembly process to separate the sub-strings of characters from each other is carried out in such a way that, when one sub-string of characters is separated from the remaining sub-strings of characters, a character following immediately the tail character of the separated sub-string of characters becomes the head character of the character sub-string following the separated sub-string of characters. The sub-strings of characters separated from each other in a disassembly process are then coded sequentially. Prior to the disassembly process, only the head character H of a character sub-string is confirmed but the length is indeterminate. After the input data is disassembled into sub-strings of characters in accordance with the following procedure, however, the length of each character sub-string is determined.

First of all, already coded data Qenc is searched for a character matching the head character H of a character sub-string s to be separated in a disassembly process. The already coded data Qenc is a string of characters equal to input data starting from the head character of the input data and ending at the tail character of an already coded sub-string of characters. A range Qewin determined in advance has been set in the already coded data Qenc at a position relative to the character sub-string s to be separated in the disassembly process. The already coded data Qenc can be compared with only characters of the range Qewin. The range Qewin is also referred to as a slide window, a slide dictionary or another name.

When the range Qewin of the already coded data Qenc is searched for characters each matching the head character H of a character sub-string s to be separated in the disassembly process and at least one character is found in the search process, all character sub-strings each having the found character as its head character are each taken as an object of comparison with the character sub-string s. The comparison is carried out by gradually increasing the length of the character sub-string s to search for matching ones with a maximum length. Then, the matching character sub-string with the maximum length in the range Qewin is referred to as the longest matching character sub-string mstr. The length of the longest matching character sub-string mstr is referred to as mlen. The head character of the matching character sub-string mstr in the range Qewin is identified by its position relative to the head character H. If this position is represented by NP bits, the range Qewin can be used for storing up to 2NP characters where notation 2NP denotes a value equal to the NPth power of 2. That is to say, N is the upper limit of the number of characters that can be stored in the range Qewin.

In a process to code LZSS codes, the maximum matching length mlen is compared with a predetermined threshold value PTH. First of all, let us consider a case in which the maximum matching length mlen is greater than the predetermined threshold value PTH. In this case, if the maximum matching length mlen is not greater than a maximum length lmax that can be expressed by a matching-length code, the maximum matching length mlen is set in the matching length len. If the maximum matching length mlen is greater than the maximum length lmax, on the other hand, the maximum length lmax is set in the matching length len. If the matching length len is set in this way, the character sub-string s having the matching length len and the head character H as its head character is separated in a disassembly process and coded to generate (NP+NC) bits as a PTR code, which is a combination of a code p and a code c. To put it in detail, the code p consisting of NP bits is a code representing a number showing the position mpos of the head character nH of the longest matching character sub-string mstr in the range Qewin. On the other hand, the code c consisting of NC bits is a code representing the matching length len. In this case, the value of the FLG sub-code for the PTR code is 0.

Let us assume that the threshold value PTH is 2 and a sub-string of three characters 'fgh' in a slide window 111 of a data buffer 110 is detected in a search process as a character sub-string matching a character sub-string immediately following the slide window 111 as shown in FIG.

43A. In this case, a matching length defined as the length of the character sub-string matching a character sub-string immediately following the slide window 111 is three characters. The head character of the sub-string of three characters 'fgh' in a slide window 111 is the character 'f' and the relative position of the head character in the slide window 111 is a position of four. Thus, the PTR code is (4, 3). The FLG sub-code is set at 0 indicating that the code obtained as a result of the coding process is a PTR code.

If the maximum matching length mlen is not greater than the threshold value PTH or there is no character sub-string matching already coded data, on the other hand, only the head character H of the character sub-string is subjected to a disassembly process and the head character H is used as a RAW code having a length of M bits as it is. In this case, the FLG sub-code is set at 1 indicating that the code obtained as a result of the coding process is a RAW code.

For example, there is no character sub-string included in the slide window 111 as a character sub-string matching a head character 'k' immediately following the slide window 111 as shown in FIG. 43B. In this case, the head character 'k' is output as a RAW code and the FLG sub-code is set at one indicating that the code obtained as a result of the coding process is a RAW code.

In an LZSS-code decoding process, on the other hand, all character sub-strings corresponding to input codes starting with the first one and ending with the last one in the same order as codes generated in a coding process are decoded. A character sub-string obtained as a result of the decoding process is concatenated to the tail of already decoded data Qdec as additional Qdec. In this way, the original data generated by the decoding process is obtained as a character string that becomes longer gradually. Much like the data Qenc obtained as a result of a coding process, the data Qdec obtained as a result of a decoding process is referenced by using a number indicating a position relative to a character sub-string s serving as a decoding object of the decoding process. A FLG sub-code of 0 in the input code indicates that the CODE code of the input code is a PTR code. On the other hand, a FLG sub-code of 1 in the input code indicates that the CODE code of the input code is a RAW code. In the case of a RAW code, a character string consisting of only one character is concatenated to the tail of already decoded data Qdec as the CODE code. In the case of a PTR code, on the other hand, a code p is decoded to generate the position of the head character of a matching sub-string of characters and a code c is decoded to generate the matching length of the sub-string of characters. The position and the matching length are used to determine the sub-string of characters from the already decoded data Qdec. Then, the determined sub-string of characters is copied character by character starting with the head character and a result of the copy process is concatenated to the already decoded data Qdec. In this way, a sub-string of characters is obtained as a result of a process to decode CODE codes. By copying the determined sub-string of characters one character after another one starting with the head character and concatenating a result of the copy process to the already decoded data Qdec as described above, the copy process can be carried out correctly even if the determined sub-string of characters partially or wholly overlaps the character string being decoded. The matching length of the matching sub-string of characters changes from the value of the expression (PTH+1) to the value of the expression (the NCth power of 2+PTH) where notation NC denotes the number of bits representing the matching-length code c.

As described above, a PTR code for an LZSS code is a code including a number representing the position mpos of the head character of a matching character sub-string in a data buffer and the length len of the matching character sub-string. Let us assume that we consider a case in which the length len is associated with a code having a fixed bit count NC on a 1-to-1 basis. In this case, if the bit count NC is small, only few limited lengths len can be associated with a code having the fixed bit count NC. If the bit count NC is large, on the other hand, a large number of lengths len can be associated with a code having the fixed bit count NC. However, the use of a code having a small possible bit count NC to represent information provides a higher compression efficiency than the use of a code having a large bit count NC to represent the same information.

As is generally known, it is nice to provide a search range Qewin with a size of about 8,000 characters as a search range of already coded data. For more information on the search range, the reader is suggested to refer to a document such as non-Patent Document 1 described earlier. The bit count NP of the aforementioned position mpos is determined from the size of the search range Qewin. If the size of the search range Qewin is 4,092 characters, for example, a bit count NP of 12 bits can be used for expressing the aforementioned position mpos. However, a sub-string of characters to be disassembled into large lengths such as 1,000 characters does not appear frequently. Rather, the frequency of disassembling a sub-string of characters into small lengths is high. Therefore, the bit count of the length len is set at a value smaller than the bit count NP of the position mpos in many cases. Thus, in the case of a search range Qewin with a size of 4,092 characters, let us assume that a character sub-string with a length of 1,000 characters is found. Even in this case, it is possible to disassemble character sub-strings up to a character sub-string having a length equal to a maximum value limited by the bit count of the length len as the maximum value of the matching length. Let us assume for example that the bit count NC of the matching-length code is 4 and the threshold value PTH is 2. In this case, 16 different lengths, i.e., the lengths of 3 to 18, can be expressed by the matching-length code. Thus, even if the maximum value of the matching length is 1,000 characters, in the end, a string of characters is coded by disassembling the string of characters into character sub-strings each having a length not exceeding 18 characters.

As a method to get rid of this waste, an escape code showing an extension of the length is assigned to one of the 16 matching-length codes and, after a process to decode this escape code, another fixed bit count is further fetched. In this way, it is possible to adopt a conceivable method of using a code having a variable bit count, which is increased in stages. Even with this method, in order to carry out extension operations to produce a long character string such as a string having a length or 1,000 characters, the codes must be subjected to extension operations at several stages using several escape codes. Thus, this method raises problems that a short code cannot be assigned either and the processing becomes complicated.

SUMMARY

Applicants have devised apparatus/methods capable of dynamically changing a relation between the matching length and the code of the matching length in a coding process and independently switching the matching length expressible by the code of the matching length from one value to another.

In accordance with an embodiment, there is provided a coding apparatus characterized in that the coding apparatus includes:

symbol-string searching means for searching a predetermined search range of a data buffer used for holding input data for a state of matching a symbol sub-string serving as a coding object of the input data;

internal-state holding means used for holding a predetermined internal state;

matching-length coding means for assigning a matching-length code to a matching length representing the length of the symbol sub-string in a matching state detected by the symbol-string searching means as a result of a search process in an assignment process according to an internal state held by the internal-state holding means and then updating the internal state held by the internal-state holding means in accordance with the matching length; and symbol-string coding means for coding the symbol sub-string on the basis of the position of the symbol sub-string in a matching state detected by the symbol-string searching means as a result of a search process and on the basis of the matching-length code assigned by the matching-length coding means.

The coding apparatus provided in accordance with the embodiment of thus brings about a function to code a sub-string of symbols on the basis of a matching-length code assigned to a matching length in accordance with an internal state.

In the coding apparatus of the embodiment, the matching-length coding means is capable of executing control to:

reset an internal state held by the internal-state holding means to a lowest stage if the matching-length code is smaller than a predetermined threshold value;

drive an internal state held by the internal-state holding means to transit to a higher stage if the matching-length code is equal to a maximum value; and drive an internal state held by the internal-state holding means to transit to a lower stage if the matching-length code is at least equal to the predetermined threshold value but smaller than the maximum value.

The coding apparatus provided in accordance with the embodiment thus brings about a function to transit from an internal state to another internal state in accordance with the matching state of a sub-string of symbols.

In the coding apparatus provided in accordance with the embodiment, the matching-length coding means is capable of:

assigning a code determined for a matching length as the matching-length code to the matching length in an assignment process independent of an internal state held by the internal-state holding means if the matching-length code is smaller than a predetermined threshold value; and assigning a code determined for a matching length as the matching-length code to the matching length in an assignment process dependent on an internal state held by the internal-state holding means and dependent on the matching length if the matching-length code is equal to or greater than the predetermined threshold value.

The coding apparatus provided in accordance with the embodiment thus brings about a function to make a decision as to whether or not it is necessary to take the internal state into consideration in a process of determining a matching-length code to be assigned to a matching length in accordance with a relation between the matching-length code and the threshold value.

The coding apparatus provided in accordance with the embodiment further has a matching-length extension means for setting a relation between a matching length and a matching-length code to be assigned to the matching length as a relation according to an internal state held by the internal-state holding means, wherein the matching-length coding means is capable of:

assigning a code determined for a matching length as the matching-length code to the matching length in an assignment process independent of an internal state held by the internal-state holding means if the matching-length code is smaller than a predetermined threshold value; and assigning a code determined by the matching-length extension means for a matching length to the matching length as the matching-length code if the matching-length code is equal to or greater than the predetermined threshold value.

The coding apparatus provided in accordance with this embodiment thus brings about a function to resort to the matching-length extension means, which is means for setting a relation between a matching-length code and a matching length to be assigned to the matching-length code as a relation according to an internal state held by the internal-state holding means, in dependence on a relation between the matching-length code and the predetermined threshold value.

In accordance with another embodiment, there is provided a decoding apparatus including:

a decoding buffer used for holding a symbol sub-string obtained as a result of a process to decode a code string;

a code buffer used for holding the code string to be decoded; code acquisition means for acquiring symbol sub-string codes including the position of the symbol sub-string and including a matching-length code of the symbol sub-string from the code buffer;

internal-state holding means used for holding a predetermined internal state;

matching-length decoding means for decoding the matching-length code to generate a matching length represented by the matching-length code as a matching length representing the length of the symbol sub-string in a decoding process according to an internal state held by the internal-state holding means and then updating the internal state held by the internal-state holding means in accordance with the matching length; and symbol-string decoding means for decoding the symbol sub-string codes to generate the symbol sub-string represented by the symbol sub-string codes by referring to the decoding buffer in a decoding process according to the position of the symbol sub-string and according to the matching-length code of the symbol sub-string.

The decoding apparatus provided in accordance with the another embodiment of the present invention thus brings about a function to decode a code sub-string on the basis of a matching-length code assigned to a matching length in accordance with an internal state in a coding process.

In the decoding apparatus provided in accordance with this embodiment, the matching-length decoding means is capable of executing control to:

reset an internal state held by the internal-state holding means to a lowest stage if the matching-length code is smaller than a predetermined threshold value;

drive an internal state held by the internal-state holding means to transit to a higher stage if the matching-length code is equal to a maximum value; and drive an internal state held by the internal-state holding means to transit to a lower stage if the matching-length code is at least equal to the predetermined threshold value but smaller than the maximum value.

The decoding apparatus provided in accordance with the second embodiment thus brings about a function to transit from an internal state to another internal state in accordance with the matching state of a sub-string of symbols.

In the decoding apparatus provided in accordance with the another embodiment, the matching-length decoding means is capable of:

decoding a matching-length code to generate a matching length determined for the matching-length code as the length of a symbol sub-string in a decoding process independent of an internal state held by the internal-state holding means if the matching-length code is smaller than a predetermined threshold value; and decoding a matching-length code to generate a matching length determined for the matching-length code as the length of a symbol sub-string in a decoding process according to an internal state held by the internal-state holding means and according to the matching-length code if the matching-length code is equal to or greater than the predetermined threshold value.

The decoding apparatus provided in accordance with this embodiment thus brings about a function to make a decision as to whether or not it is necessary to take the internal state into consideration in a process of determining a matching length for a matching-length code in accordance with a relation between the matching-length code and the threshold value.

The decoding apparatus provided in accordance with this embodiment further has a matching-length extension means for setting a relation between a matching-length code and a matching length obtained as a result of a process to decode the matching-length code as a relation according to an internal state held by the internal-state holding means, wherein the matching-length decoding means is capable of:

decoding a matching-length code to generate a matching length determined for the matching-length code as the length of a symbol sub-string in a decoding process independent of an internal state held by the internal-state holding means if the matching-length code is smaller than a predetermined threshold value; and decoding a matching-length code to generate a matching length determined by the matching-length extension means for the matching-length code if the matching-length code is equal to or greater than the predetermined threshold value.

The decoding apparatus provided in accordance with this embodiment thus brings about a function to resort to the matching-length extension means, which is means for setting a relation between a matching-length code and a matching length obtained as a result of a process to decode the matching-length code as a relation according to an internal state held by the internal-state holding means, in dependence on a relation between the matching-length code and the predetermined threshold value.

The decoding apparatus provided in accordance with another embodiment further has a code-buffer control means for executing control to supply the code string to the code buffer in block units, wherein the matching-length decoding means executes control to store information on a process to be carried out next in advance in storage means each time one of the block units is decoded and, then, decode the next one of the block units in accordance with the stored information on the process to be carried out next.

The decoding apparatus provided in accordance with another embodiment thus brings about a function to decode a string of codes in block units in the case of a code buffer having a small storage capacity large enough for accommodating only in a block unit.

In accordance with a further embodiment, there is provided a compressed-program decompression apparatus including:

a decompressed-program buffer used for holding a symbol sub-string obtained as a result of a process to decompress a compressed program;

a compressed-program buffer used for holding the compressed program to be decompressed;

code acquisition means for acquiring symbol sub-string codes including the position of the symbol sub-string and including a matching-length code of the symbol sub-string from the compressed-program buffer;

internal-state holding means used for holding a predetermined internal state;

matching-length decoding means for decoding the matching-length code to generate a matching length representing the length of the symbol sub-string in a decoding process according to an internal state held by the internal-state holding means and then updating the internal state held by the internal-state holding means in accordance with the matching length; and symbol-string decoding means for decoding the symbol sub-string codes to generate the symbol sub-string represented by the symbol sub-string codes by referring to the decompressed-program buffer in a decoding process according to the position of the symbol sub-string and according to the matching-length code of the symbol sub-string.

The compressed-program decompression apparatus provided in accordance with this embodiment thus brings about a function to decode a code sub-string included in a compressed program on the basis of a matching-length code assigned to a matching length in accordance with an internal state in a compression process.

In accordance with another embodiment, there is provided a program characterized in that the program is to be executed by a computer to implement a coding method including the steps of:

searching a predetermined search range of a data buffer used for holding input data for a state of matching a symbol sub-string serving as a coding object of the input data;

assigning a matching-length code to a matching length representing the length of the symbol sub-string in a matching state detected as a result of a search process in an assignment process according to a predetermined internal state;

updating the internal state in accordance with the matching length; and coding the symbol sub-string on the basis of the relative address of a location included in the data buffer as the location of the symbol sub-string in a matching state detected as a result of a search process and on the basis of the matching-length code.

The program provided in accordance with this embodiment thus brings about a function to decode a code sub-string included in a compressed program on the basis of a matching-length code assigned to a matching length in accordance with an internal state.

In accordance with another embodiment, there is provided a program to be executed by a computer to implement a decoding method for decoding a code string held in a code buffer in a code decoding process and storing a symbol sub-string obtained as a result of the code decoding process in a decoding buffer. The program is characterized in that the decoding method includes the steps of:

acquiring symbol sub-string codes including a relative address of the symbol sub-string and including a matching-length code of the symbol sub-string from the code buffer;

decoding the matching-length code to generate a matching length representing the length of the symbol sub-string in a length decoding process according to a predetermined internal state;

updating the internal state in accordance with the matching length obtained as a result of the length decoding process; and decoding the symbol sub-string codes to generate the symbol sub-string represented by the symbol sub-string codes by referring to the decoding buffer in a string decoding process according to the relative address of the symbol sub-string and according to the matching-length code of the symbol sub-string.

The program provided in accordance this embodiment thus brings about a function to decode a code sub-string on the basis of a matching-length code assigned to a matching length in accordance with an internal state in a coding process.

In accordance with the embodiments of the present invention, a relation between a matching length and a matching-length code of the matching length is changed dynamically in the course of a coding process. Thus, the embodiments of the present invention exhibit an excellent effect of an ability to independently switch the length that can be expressed by the matching-length code from a value to another.

Additional features and advantages are described herein, and will be apparent from, the following Detailed Description and the figures.

BRIEF DESCRIPTION OF THE FIGURES

FIGS. 4A and 4B show tables of typical relations between a matching-length code c and a matching length len as relations according to an embodiment;

FIG. 40 is a table showing compression rates of a sub-string of characters as compression rates according to an embodiment;

FIG. 41 is a diagram showing a typical distribution of maximum matching lengths of character sub-strings in an embodiment;

DETAILED DESCRIPTION

Next, embodiments of the present invention are explained in detail by referring to diagrams.

Figure 1:
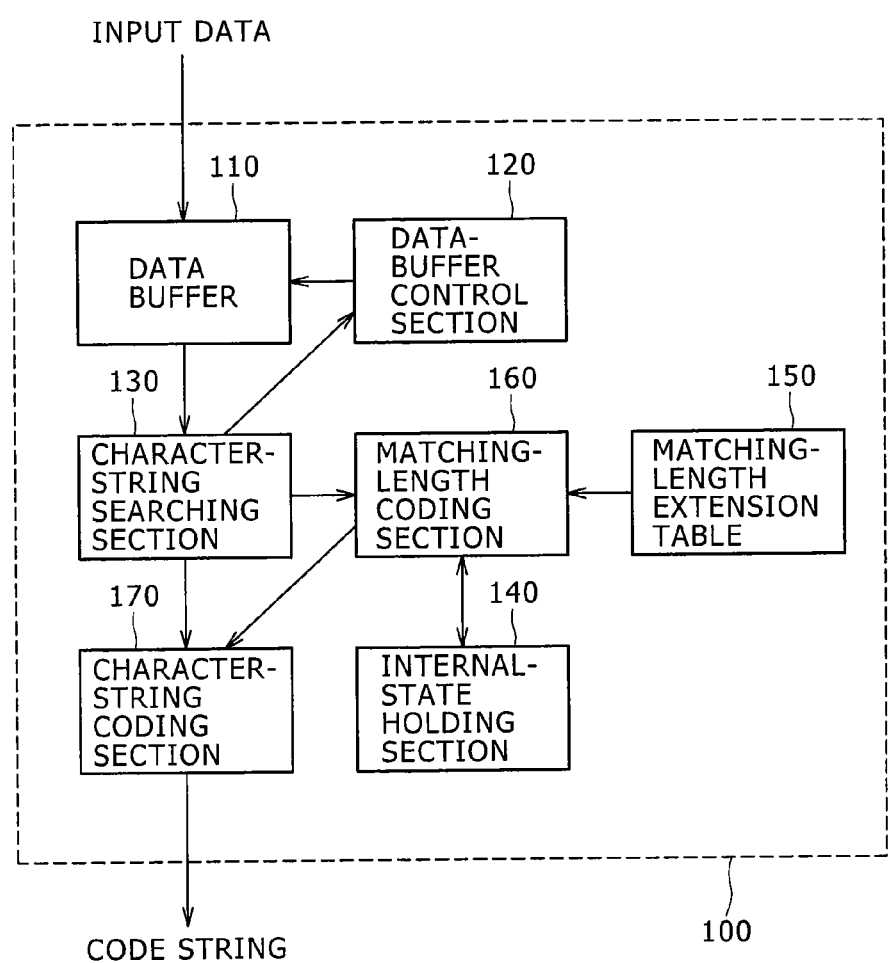
FIG. 1 is a block diagram showing a typical configuration of a data coding apparatus according to an embodiment.

FIG. 1 is a block diagram showing a typical configuration of a data coding apparatus 100 according to an embodiment. As shown in the figure, the data coding apparatus 100 includes a data buffer 110, a data-buffer control section 120, a character-string searching section 130, an internal-state holding section 140, a matching-length extension table 150, a matching-length coding section 160 and a character-string coding section 170.

The data buffer 110 is a buffer for properly holding input data to be encoded. The input data stored in the data buffer 110 is not deleted immediately even after being coded. Instead, the data buffer 110 keeps temporarily holding the input data as already coded data for a search purpose. The search range of the already coded data is referred to as a slide window or a slide dictionary.

The data-buffer control section 120 is a section for executing control of the data buffer 110 in accordance with the state of coding progress. To put it concretely, the data-buffer control section 120 carries out processing such as a process to receive input data to be held in the data buffer 110, a process to output already coded data from the data buffer 110 and a process to manage the slide window.

The character-string searching section 130 is a section for searching the slide window in the data buffer 110 for a character string matching a character sub-string positioned right after the slide window. If the character-string searching section 130 finds a matching character string with a length not smaller than a predetermined value in the search process, the position of the head character of the matching character string in the slide window and the length of the matching character string are generated. In the following description, the length of the matching character string is referred to as a matching length. If the character-string searching section 130 does not find a matching character string with a length not smaller than the predetermined value in the search process or if the character-string searching section 130 finds a matching character string with a length smaller than the predetermined value in the search process, on the other hand, a head character positioned right after the slide window is output from the data coding apparatus 100 as it is.

The internal-state holding section 140 is a section for holding an internal state of the embodiment of the present invention. As will be described later, the internal state is a result of a state transition according to the state of the encoding progress. Under a predetermined condition, the internal state stored in the internal-state holding section 140 is a factor determining a relation between the matching length and its code, which is referred to as a matching-length code.

The matching-length extension table 150 is a table showing the relation between the matching length and its code, which is the matching-length code cited above. As will be described later, the relation between the matching length and the matching-length code is dependent on the internal state stored in the internal-state holding section 140.

The matching-length coding section 160 is a section for assigning a matching-length code corresponding to a matching length generated by the character-string searching section 130 to the matching length. To put it concretely, the matching-length coding section 160 refers to the matching-length extension table 150 in order to find the matching-length code for a matching length as a matching-length code corresponding to the internal state stored in the internal-state holding section 140 in a process to code the matching length. As shown in FIG. 4, the matching-length extension table 150 shows relations between the matching length and the matching-length code as relations, which are independent of the internal state stored in the internal-state holding section 140 for matching-length codes not greater than a predetermined threshold value. If the matching-length code is greater than the predetermined threshold value, however, the relations between the matching length and the matching-length code are dependent on the internal state stored in the internal-state holding section 140.

The character-string coding section 170 is a section for coding a sub-string of characters. If the character-string searching section 130 finds a character string with a length not smaller than a predetermined value in the search process as a character string matching a character sub-string positioned at a location immediately following a slide window, the character-string coding section 170 outputs the position of the head character of the character string in the slide window and a matching-length code as the code of the character string. As described above, the matching-length code is a code assigned by the matching-length coding section 160 to the matching length of the character string. If the character-string searching section 130 does not find a character string with a length not smaller than the predetermined value in the search process or if the character-string searching section 130 finds a character string with a length smaller than the predetermined value in the search process, on the other hand, a head character immediately following the slide window is output from the data coding apparatus 100 as it is as the code of the character.

Figure 2A:
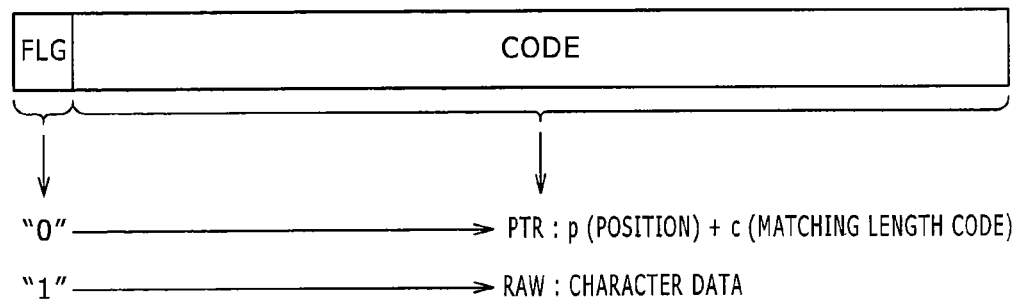
FIGS. 2A and 2B show diagrams of the data structures of a code output by the data coding apparatus as a code according to an embodiment.

FIG. 2 shows diagrams of the data structures of a code output by the data coding apparatus 100 as a code according to the embodiment of the present invention. As shown in FIG. 2A, there are two formats of the CODE code, i.e., PTR and RAW codes. The PTR code includes the position p of the head character of a character string included in the slide window as a character string matching a character sub-string positioned right after the slide window and its matching-length code c. On the other hand, the RAW code is the character data itself.

A FLG sub-code included in the CODE code as shown in FIG. 2A is a flag indicating whether the CODE code is PTR or RAW. To be more specific, a FLG sub-code of 0 indicates that the CODE code is PTR. On the other hand, a FLG sub-code of 1 indicates that the CODE code is RAW.

Figure 2B:
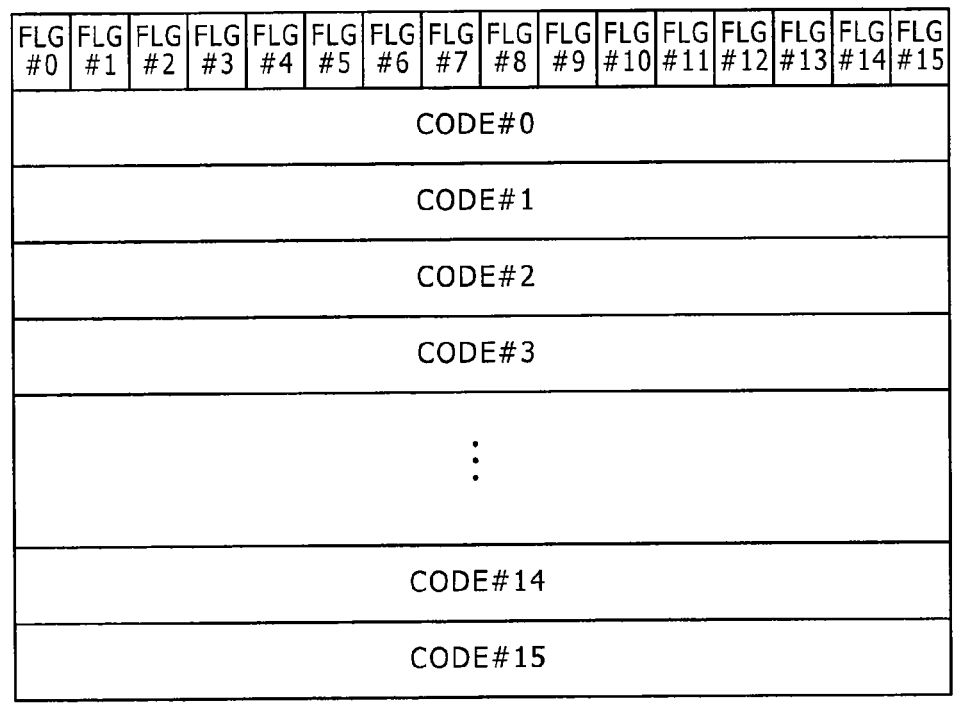

It is assumed that the width of the FLG sub-code is 1 bit and the width of the CODE code is 16 bits. In this case, a conceivable layout of FLG sub-codes and CODE codes in a memory is shown in FIG. 2B. As shown in the figure, FLG sub-codes #0 to #15 for 16 CODE codes #0 to #15 respectively are collected and laid out in an array. In this way, fragmentation of the memory can be avoided. It is to be noted that this layout is no more than a typical layout. For example, a FLG sub-code can be placed at a position adjacent to a CODE code associated with the FLG sub-code. As another alternative, 32 or more FLG sub-codes can also be collected and laid out in an array.

Figure 3:
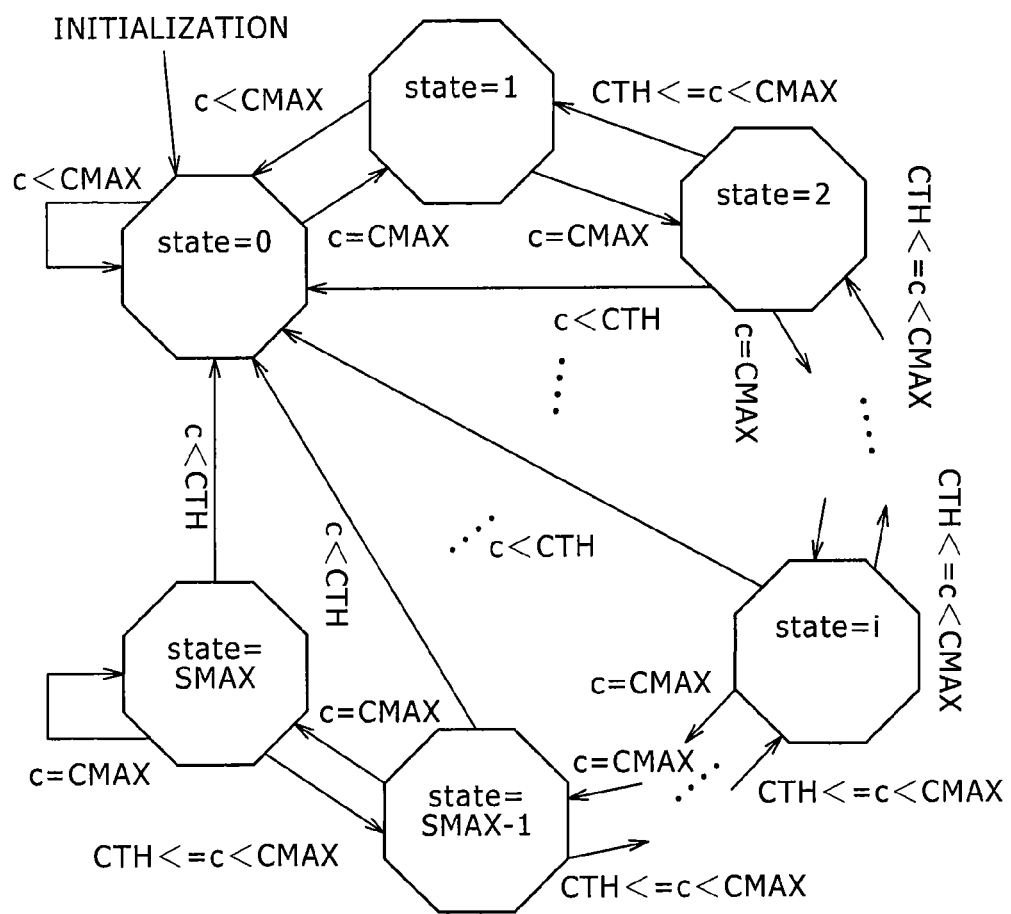
FIG. 3 is a diagram showing typical transitions among internal states of an embodiment.

FIG. 3 is a diagram showing typical transitions among internal states of the embodiment of the present invention. There are (SMAX+1) possible internal states, i.e., internal states 0 to SMAX. As shown in the figure, an internal state transits to another internal state in accordance with the value of the matching-length code c.

Let us assume that the present internal state is st. In this case, in accordance with the value of the matching-length code c of the immediately preceding character sub-string, the present internal state st may transit to an internal state with a smaller or larger state number. An internal state with a smaller state number is the internal state 0 or (st−1) while an internal state with a larger state number is the internal state (st+1) or SMAX. To be more specific, if the matching-length code c assigned to the matching length len of the immediately preceding character sub-string is relatively large, the present internal state st transits to the internal state (st+1) or SMAX. If the matching-length code c assigned to the matching length len of the immediately preceding character sub-string is relatively small, on the other hand, the present internal state st transits to the internal state 0 or (st−1).

The matching-length code c has one of (CMAX+1) possible values, i.e., 0 to CMAX. Let us assume a threshold value CTH satisfying the relations 0≦CTH<CMAX for the matching-length code c. For a value of the matching-length code c satisfying the relations 0≦c≦CTH, the value of the matching length is represented by L (c), which is independent of the internal state. In this case, the value of the matching length is expressed by adoption of the same assignment method as LZSS codes. For a value of the matching-length code c satisfying the relations CTH<c≦CMAX, on the other hand, the value of the matching length is represented by L (c) [st], which is dependent on the internal state. This is because it is anticipated that, in actuality, there are many processes to code a short string of characters after a long character sub-string having a large matching length and the occurrence frequency of short character strings is high as long as the data is not simple data.

The initial state of the internal state is the state 0. In this state, a small length is associated with the matching-length code c much like an LZSS code. When the matching length obtained after a process to code one sub-string of characters has a value of L (CMAX) [st] corresponding to the maximum value CMAX of the matching-length code c in the state, the coding process is considered to have been carried out to generate a matching length smaller than the actual matching length, which is the largest matching length mlen described before. For this reason, in this case, the internal state is driven to transit to a state with its number incremented by 1 by increasing the matching length value of L (CMAX) [st] to keep up with a larger matching length in the next process.

If the matching length is smaller than L (CMAX) [st] but at least equal to L (CTH) [st], the internal state is driven to transit to a state with its number decremented by 1 so as to softly reduce L (CMAX) [st].

If the matching length is smaller than L (CTH) [st], the occurrence frequency of long character sub-strings is considered to have a small value. Thus, in order to immediately return to the initial state, the internal state is driven to transit to the state 0. In addition, in the case of a RAW code, the matching length is interpreted to be a length of 0. Also in this case, the internal state is driven immediately to transit to the state 0.

Note that it is assumed that, in the following description, the width NC of the matching-length code c is 4 bits, the width NP of the position p is 12 bits, the threshold value CTH of the matching-length code c is 13, the maximum value CMAX of the matching-length code c is 15 and the maximum value SMAX of the internal state is 3.

FIG. 4 shows tables of typical relations between the matching-length code c and the matching length len as relations according to the embodiment. As shown in FIG. 4A, for values of the matching-length code c in the range 0 to 13, which is the threshold value CTH of the matching-length code c, a fixed value of the matching length len is assigned to each of the values of the matching-length code c. The assigned fixed value of the matching length len is expressed by an expression of (c+PTH+1), which is independent of the internal state. For values of the matching-length code c in the range 14 to 15 exceeding the threshold value CTH of the matching-length code c, on the other hand, a value determined independently of the internal state as the value of the matching length len is assigned to each of the values of the matching-length code c as shown in FIG. 4B. Notation PTH in the expression of (c+PTH+1) denotes a threshold value provided to prevent a matching length len too small for a matching-length code c from being assigned to the matching-length code c. In this embodiment, the value of PTH is 2. Thus, if the matching length len is 2 or smaller, the matching length len is not associated with a matching-length code c. That is to say, the character itself is used as a RAW code.

FIG. 4B is a table showing values of L (c) [state], which is the matching length len for a matching-length code c in the range 14 to 15. The table shown in FIG. 4B corresponds to the matching-length extension table 150 included in the configuration shown in FIG. 1. Assume that notation x denotes the value of the matching-length code c and notation y denotes the value of the internal state. Thus, notation L (x) [y] denotes L (c) [state]. In this case, the values of x and y satisfy the following conditions: For x greater than CTH, a matching length len (=L (x) [y]+1) is assigned to x and the following relations hold true:

$L(CTH) < L(x)[y]$ $L(x)[y] < L(x+1)[y]$ $L(x)[y] < L(x)[y+1]$.

As is obvious from the above conditions, as the values of x and y increase, the value of L (x) [y] also increases. In the case of the example shown in FIG. 4, for the internal state y=3 and the matching-length code c=15, a maximum matching length len of 1,792(=1,791+1) is assigned to the matching-length code c.

Figure 5:
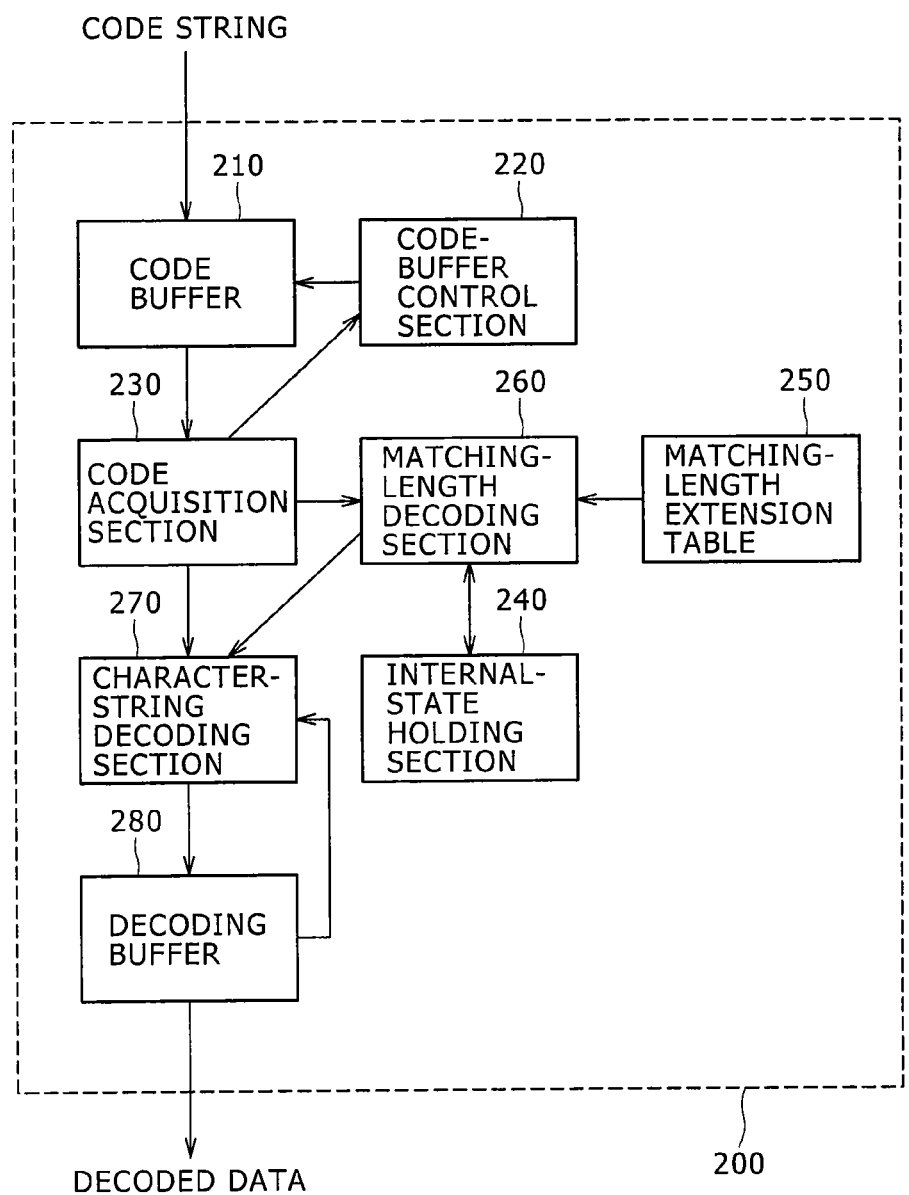
FIG. 5 is a block diagram showing a typical configuration of a decoding apparatus 200 according to an embodiment.

FIG. 5 is a block diagram showing a typical configuration of a decoding apparatus 200 according to an embodiment of the present invention. As shown in the figure, the decoding apparatus 200 includes a code buffer 210, a code-buffer control section 220, a code acquisition section 230, an internal-state holding section 240, a matching-length extension table 250, a matching-length decoding section 260, a character-string decoding section 270 and a decoding buffer 280.

The code buffer 210 is a buffer for properly storing a string of codes to be decoded. There are two methods of holding a string of codes in the code buffer 210. In accordance with one of the methods, the entire sting of codes is stored as a batch in the code buffer 210. In accordance with the other method, on the other hand, the string of codes is divided into predetermined blocks, each of which is then stored sequentially in the code buffer 210.

The code-buffer control section 220 is a section for executing control of the code buffer 210. To put it concretely, the code-buffer control section 220 executes control of storing a string of codes in the code buffer 210 as a batch or storing a string of codes in the code buffer 210 by dividing the string of codes into blocks.

The code acquisition section 230 is a section for acquiring a desired code from the code buffer 210 and interpreting a CODE code in accordance with the FLG sub-code. That is to say, if the FLG sub-code is 0, the code acquisition section 230 extracts a position p and a matching-length code c from the CODE code, which is a PTR code. If the FLG sub-code is 1, on the other hand, the code acquisition section 230 extracts character data from the CODE code, which is a RAW code.

The internal-state holding section 240 is a section for holding an internal state of the embodiment of the present invention. The internal-state holding section 240 has a function similar to the internal-state holding section 140 employed in the data coding apparatus 100 explained earlier by referring to FIG. 1. The matching-length extension table 250 is a table showing a relation between the matching length and a matching-length code, which is a code representing the matching length. The relation between the matching length and the matching-length code is determined by the internal state held in the internal-state holding section 240. That is to say, the matching-length extension table 250 has a function similar to the matching-length extension table 150 employed in the data coding apparatus 100 explained earlier by referring to FIG. 1.

The matching-length decoding section 260 is a section for determining a matching length corresponding to a matching-length code extracted by the code acquisition section 230 for the matching-length code. To put it concretely, in order to decode the matching-length code into a matching length, the matching-length decoding section 260 searches the matching-length extension table 250 for the matching length corresponding to the matching-length code as a matching length associated with the internal state stored in the internal-state holding section 240. If the matching-length code is smaller than a predetermined threshold value, however, the matching-length decoding section 260 decodes the matching-length code to generate a matching length independent of the internal state stored in the internal-state holding section 240.

The character-string decoding section 270 is a section for decoding a string of codes to generate a character or a string of characters and stores the character or the string of characters in the decoding buffer 280. In the case of a PTR code, on the basis of a position received from the code acquisition section 230 and a search length received from the matching-length decoding section 260, the character-string decoding section 270 searches the decoding buffer 280 for a string of characters as a result of decoding. In the case of a RAW code, on the other hand, the character data of the RAW code is used as a character resulting from the decoding process.

The decoding buffer 280 is a buffer for storing a character or a string of characters as a result of a decoding process carried out by the character-string decoding section 270. A character string stored in the decoding buffer 280 is output as data obtained as a result of the decoding process carried out by the character-string decoding section 270 and used in the decoding process.

Next, operations carried out by the data coding apparatus 100 and the decoding apparatus 200, which are implemented by the embodiments, are explained by referring to diagrams as follows.

Figure 6A:
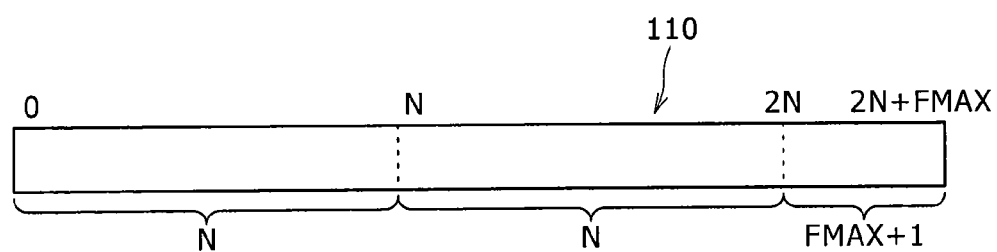
FIGS. 6A to 6D are diagrams each showing a relation to be used in the following description as a relation provided by an embodiment of the present invention as a relation between a data buffer and a slide window.

FIGS. 6A to 6D are diagrams showing a relation to be used in the following description. The relation shown in the figures as a relation according to the embodiment of the present invention is a relation between the data buffer 110 and a slide window 111. As shown in FIG. 6A, in this example, the data buffer 110 is assumed to have a storage capacity for storing (2N+FMAX+1) characters where notation N denotes the maximum capacity of the slide window 111 and notation FMAX denotes L (CMAX) [SMAX], which is the maximum value of the matching length.

Figure 6B:
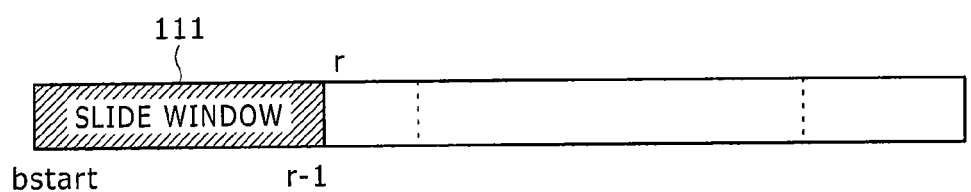

As shown in FIG. 6B, initially, the slide window 111 is placed at the head of the data buffer 110. The slide window 111 is positioned as a range from bstart to (r−1) where notation bstart denotes the start address of an effective area of the data buffer 110 and notation r denotes a variable representing the position of a head character immediately following the slide window 111.

Figure 6C:
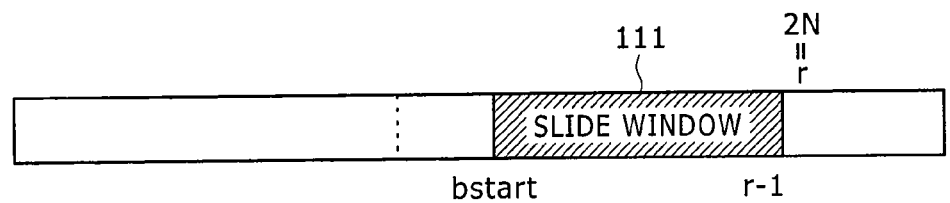
Figure 6D:
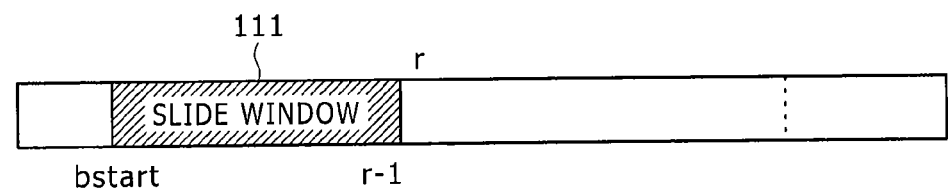

With the progress of the coding process, the slide window 111 moves in the direction toward the right end. Then, as shown in FIG. 6C, when the variable r reaches at least 2N, the slide window 111 is returned in the direction toward the left end by N to be positioned as shown in FIG. 6D.

Figure 7:
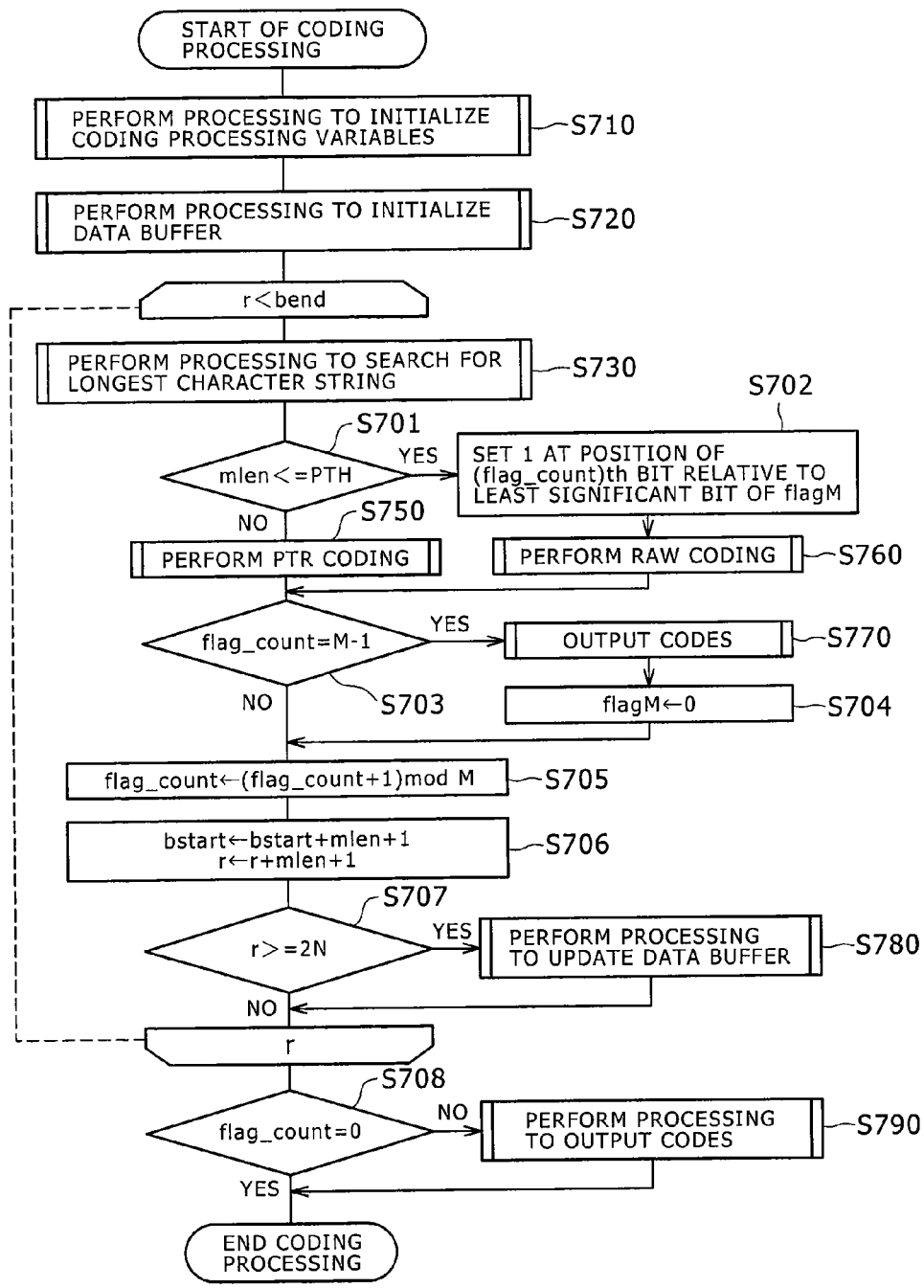
FIG. 7 shows a flowchart representing the main stream of a coding process according to an embodiment.

FIG. 7 shows a flowchart representing the main stream of a coding process according to an embodiment of the present invention. As shown in the figure, the flowchart begins with a step S710 at which variables used in the coding process are initialized. Then, in a process carried out at the next step S720, the data buffer 110 is initialized. Subsequently, the following processing is carried out repeatedly as long as the variable r is smaller than the bend, which is the end address of the effective area of the data buffer 110.

In a process carried out at the next step S730, with the head character at a position indicated by the variable r taken as a reference, the slide window 111 is searched for a matching string of characters. Then, in a process carried out at the next step S701, the actually matching length (that is, the maximum matching length mien) is compared with the threshold value PTH. If the actually matching length is found greater than the threshold value PTH, the flow of the processing goes on to a step S750 at which the coding process is carried out to produce a PTR code. If the actually matching length is not greater than the threshold value PTH, on the other hand, the flow of the processing goes on to a step S760 at which the coding process is carried out to produce a RAW code. In the case of the coding process carried out to produce a RAW code, in a process carried out at a step S702 preceding the step S760, a (flag_count)th bit is set at 1. The (flag_count)th bit is a bit found by counting the number of bits starting with the least significant bit of a variable flgM till the count value obtained as the result of the counting becomes equal to the value of a variable flag_count. The variable flgM is data with a length of M bits representing M FLG sub-codes. That is to say, the variable flgM is an array of sequentially arranged FLG sub-codes starting at the LSB (Least Significant Bit) of the variable. On the other hand, the variable flag_count is a counter for counting the number of FLG sub-codes.

As will be described later, the value of the variable flag_count is incremented. An incremented value found equal to (M−1) in a process carried out at a next step S703 reveals the fact that repeated operations to sequentially set the M FLG sub-codes have been completed. In this case, the flow of the processing goes on to a step S770 at which the M FLG sub-codes and the CODE codes are output. Then, in a process carried out at the next step S704, the variable flgM is reset to be used in the next processing.

In a process carried out at a next step S705, the variable flag_count is incremented by 1. When the variable flag_count incremented by 1 becomes equal to M, the variable flag_count is reset to 0. That is to say, the variable flag_count incremented by 1 is divided by M and the remainder of the division is used as an updated value of the variable flag_count.

Then, in a process carried out at the next step S706, the start address bstart of the effective area of the data buffer 110 is updated by adding the maximum matching length mien incremented by 1 to the start address bstart. By the same token, the variable r is updated by adding the maximum matching length mlen incremented by 1 to the variable r. Thus, the slide window 111 is shifted by a distance equal to the length of the already coded character sub-string.

As the variable r becomes equal to at least 2N as shown in FIG. 6C, the slide window 111 is returned in the direction toward the left end by N as explained earlier by referring to FIG. 6D in order to update the data buffer 110 in a process carried out at a step S780.

A variable flag_count not equal to 0 in a process carried out at a step S708 after repetition of the processing described above a number of times reveals the existence of a code not output yet. In this case, the flow of the processing goes on to a step S790 at which remaining FLG sub-codes and the remaining CODE codes are output. Finally, the execution of the coding processing is ended.

Figure 8:
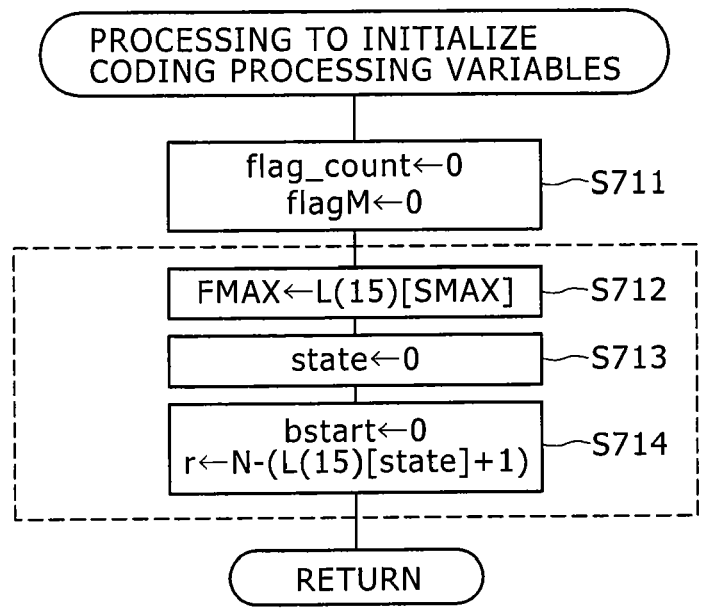
FIG. 8 shows a flowchart representing the procedure of processing to initialize coding processing variables in accordance with an embodiment.

FIG. 8 shows a flowchart representing the procedure of processing to initialize coding processing variables in accordance with an embodiment of the present invention. The processing to initialize coding processing variables corresponds to the process carried out at the step S710 of the flowchart shown in FIG. 7 as a flowchart representing the coding processing.

As shown in FIG. 8, the flowchart begins with a step S711 at which the variable flag_count and the variable flgM are each reset to 0. As described earlier, the variable flag_count is a counter for counting the number of FLG sub-codes. On the other hand, the variable flgM is an array of FLG sub-codes. Then, in a process carried out at the next step S712, FMAX representing a maximum value used in a process to search for a sub-string of codes as the maximum value of the lengths of code sub-strings is set at L (15) [3], which is the maximum matching length len in this example. Subsequently, in a process carried out at the next step S713, the internal state is reset to 0.

Finally, in a process carried out at the next step S714, the start address bstart of the effective area of the data buffer 110 is reset to 0 and the variable r showing the position of a head character immediately following the slide window 111 is set at (N−L (15) [0]+1). As explained earlier by referring to FIG. 6B, the slide window 111 is positioned as a range from the start address bstart to (r−1).

It is to be noted that, the processing to initialize the coding processing variables, processes carried out at the steps S712 to S714 are processes peculiar to the embodiment.

Figure 9:
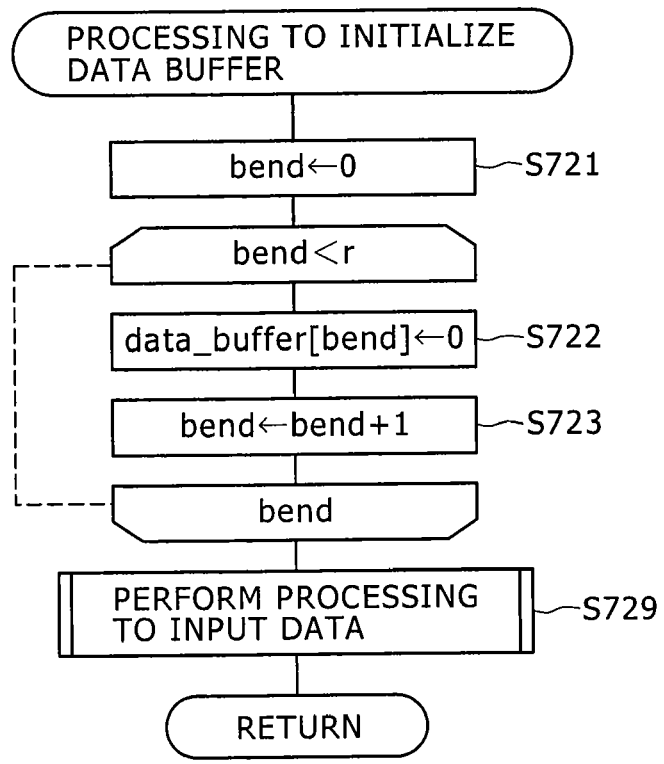
FIG. 9 shows a flowchart representing the procedure of processing to initialize the data buffer 110 in accordance with an embodiment.

FIG. 9 shows a flowchart representing the procedure of processing to initialize the data buffer 110 in accordance with an embodiment. The processing to initialize the data buffer 110 corresponds to the process carried out at the step S720 of the flowchart shown in FIG. 7 as a flowchart representing the coding processing.

As shown in FIG. 9, the flowchart begins with a step S721 at which the end address bend of the effective area of the data buffer 110 is reset to 0. Then, in a process carried out at the next step S722, an element data_buffer [bend] of the data buffer 110 is set to 0. Subsequently, in a process carried out at the next step S723, the end address bend is incremented by 1. The processes of the steps S722 and S723 are carried out repeatedly as long as the end address bend is smaller than the value of the variable r.

With the value 0 set in the slide window 111 as described above, input data is stored in the remaining portion of the data buffer 110 in a process carried out at the next step S729.

Figure 10:
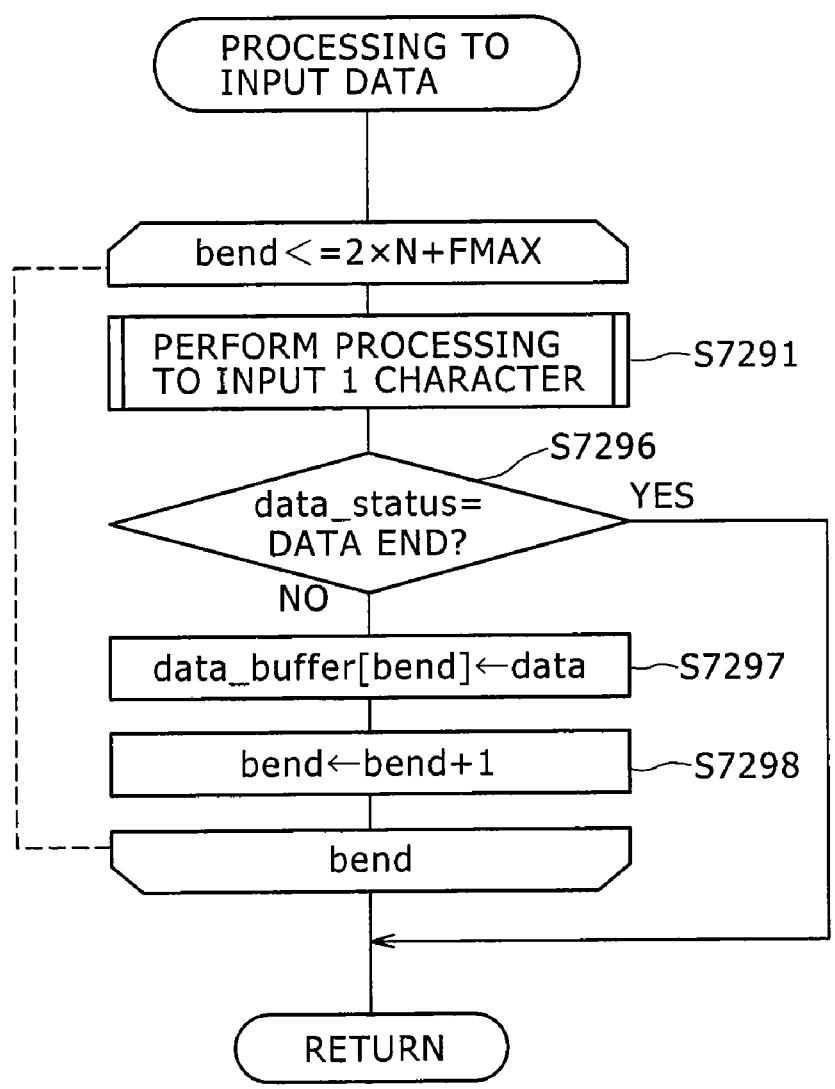
FIG. 10 shows a flowchart representing the procedure of processing to input data in accordance with an embodiment.

FIG. 10 shows a flowchart representing the procedure of processing to input data in accordance with an embodiment. The processing to input data corresponds to the process carried out at the step S729 of the flowchart shown in FIG. 9 as a flowchart representing the processing to initialize the data buffer 110 and a process carried out at a step S789 of a flowchart shown in FIG. 16 as a flowchart representing the processing to update the data buffer 110 as will be described later.

In the processing to input data, the following processing is carried out repeatedly while the end address bend of the effective area of the data buffer 110 is being incremented by 1 at one time in a process carried out at a step S7298 as long as the end address bend is smaller than the end of the data buffer 110, that is, as long as the end address bend is smaller than (2N+FMAX). First of all, in a process carried out at a next step S7291, a character of the input data is input. Then, in a process carried out at the next step S7296, a variable data_status indicating the state of the input data is examined to determine whether or not the variable data_status indicates the end of the input data. If the variable data_status does not indicate the end of the input data, the flow of the processing goes on to a step S7297 at which the input character is set in an element data_buffer [bend] of the data buffer 110.

Figure 11:
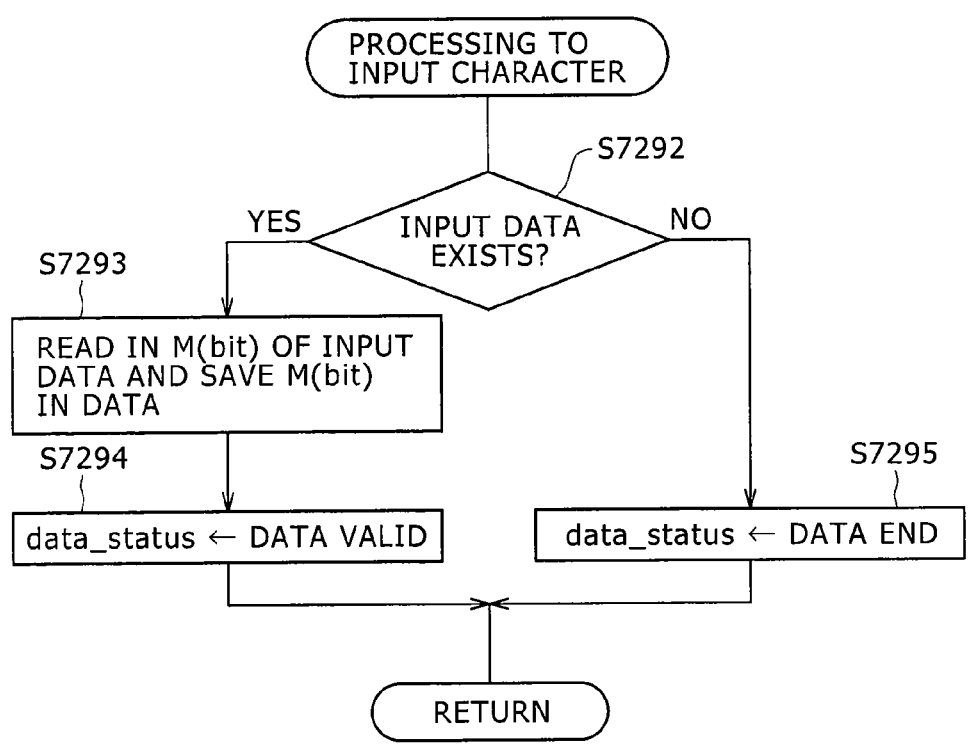
FIG. 11 shows a flowchart representing the procedure of processing to input one character in accordance with an embodiment.

FIG. 11 shows a flowchart representing the procedure of processing to input a character in accordance with an embodiment. The processing to input a character corresponds to the step S7291 of the flowchart shown in FIG. 10 as a flowchart representing processing to input data.

First of all, in a process carried out at a next step S7292, the data buffer 110 is examined to determine whether or not input data still remains in the data buffer 110. If input data still remains in the data buffer 110, the flow of the processing goes on to a step S7293 at which M bits of the input data are fetched and held in a variable data. Then, in a process carried out at the next step S7294, the variable data_status is set at a value revealing valid data. If input data no longer remains in the data buffer 110, on the other hand, the flow of the processing goes on to a step S7295 at which the variable data_status is set at a value revealing the end of the input data.

Figure 12:
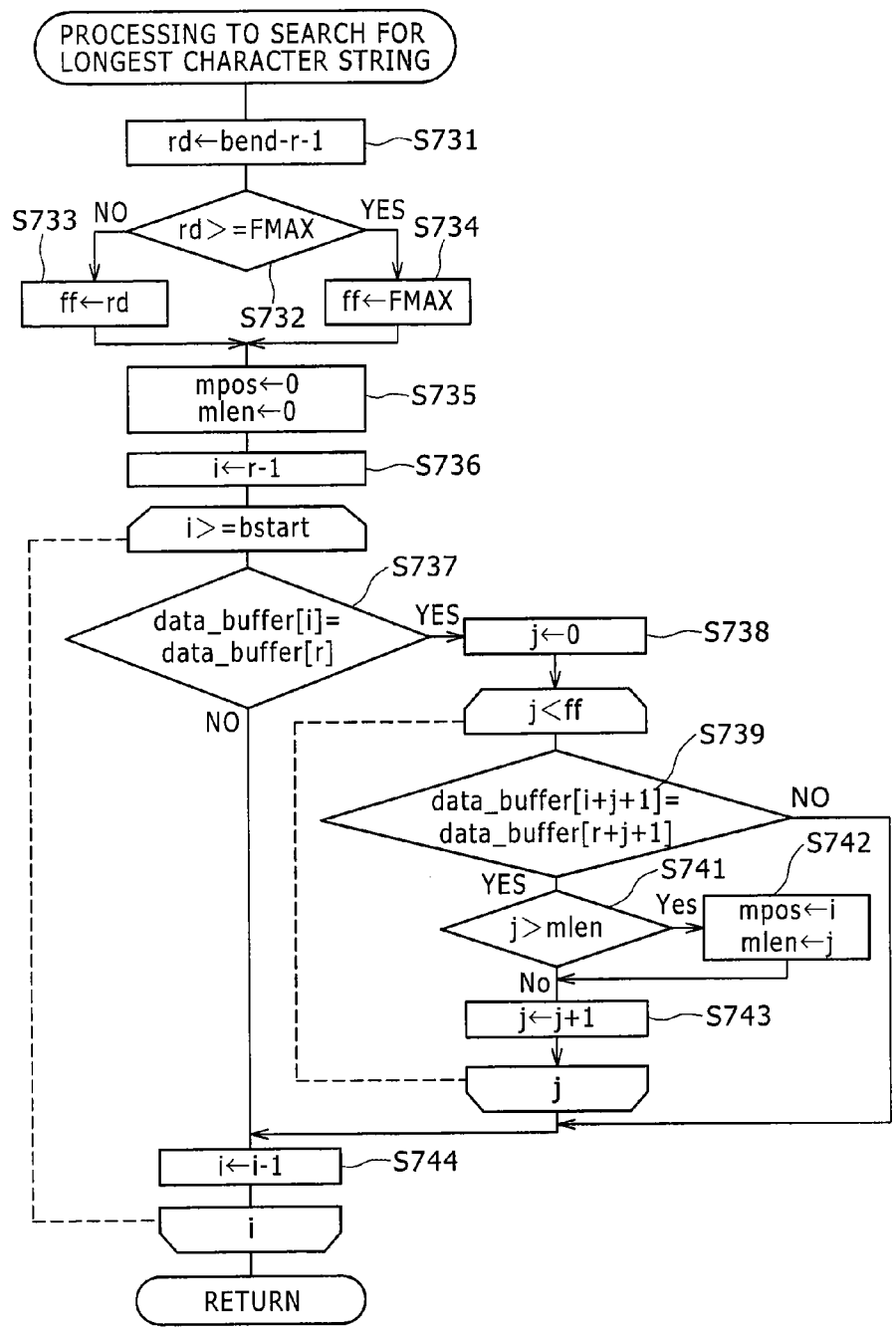
FIG. 12 shows a flowchart representing the procedure of processing to search for a longest matching string of characters in accordance with an embodiment.

FIG. 12 shows a flowchart representing the procedure of processing to search for a longest matching string of characters in accordance with an embodiment of the present invention. This processing to search for a longest matching string of characters corresponds to the process carried out at the step S730 of the flowchart shown in FIG. 7 as a flowchart representing the coding processing.

First of all, in a process carried out at a step S731, a difference between the end address bend of the effective area of the data buffer 110 and the variable r is found and set in a difference variable rd. Then, in a process carried out at the next step S732, the difference variable rd is compared with FMAX. If the difference variable rd is found at least equal to FMAX, the flow of the processing goes on to a step S734 at which FMAX is set in a variable ff. If the difference variable rd is found smaller than FMAX, on the other hand, the flow of the processing goes on to a step S733 at which the contents of the difference variable are set in the variable ff.

In either case, the flow of the processing goes on to the next step S735 at which a variable mpos representing the position of the head character of the matching character string and a variable mlen representing the maximum matching length are each reset to 0. Then, in a process carried out at the next step S736, the value of (r−1) representing the boundary of the slide window is set in a variable i. Subsequently, while the variable i is being decremented by 1 at one time in a process carried out at a next step S744 the following processing is carried out repeatedly as long as the variable i is greater than or equal to the start address bstart of the effective area of the data buffer 110.

In the repeated processing, if a determination result produced in a process carried out at a step S737 indicates that an element data_buffer [i] matches an element data_buffer [r], the flow of the processing goes on to a step S738 at which a variable j is reset to 0. Then, while the variable j is being incremented by 1 at one time in a process carried out at a next step S743 the following sub-processing is carried out repeatedly as long as the variable j is smaller than the variable ff. In the repeated sub-processing, if a determination result produced in a process carried out at a step S739 indicates that the element data_buffer [i+j+1] matches the element data_buffer [r+j+1] and a determination result produced in a process carried out at a step S741 indicates that the variable j is greater than the maximum matching length mlen, the flow of the processing goes on to a step S742 at which the value of the variable i is set in the variable mpos and the value of the variable j is set in the variable mlen as a new maximum matching length.

In the processing to search for a longest matching string of characters as described above, the slide window is searched for the same character as a head character immediately following the slide window. If such a character is found in the search process, the slide window is searched for a longest character matching string having the character as its head character. The longest character matching string is a character string matching a character string immediately following the slide window with as large a length as possible. If such a longest matching string of characters is found in the search process, the value of the expression (matching length−1) is set in the variable mlen and the position of the character in the data buffer 110 is set in the variable mpos. If such a character is not found in the search process, on the other hand, the variable mien is reset to 0 before going on to the next processing.

Figure 13:
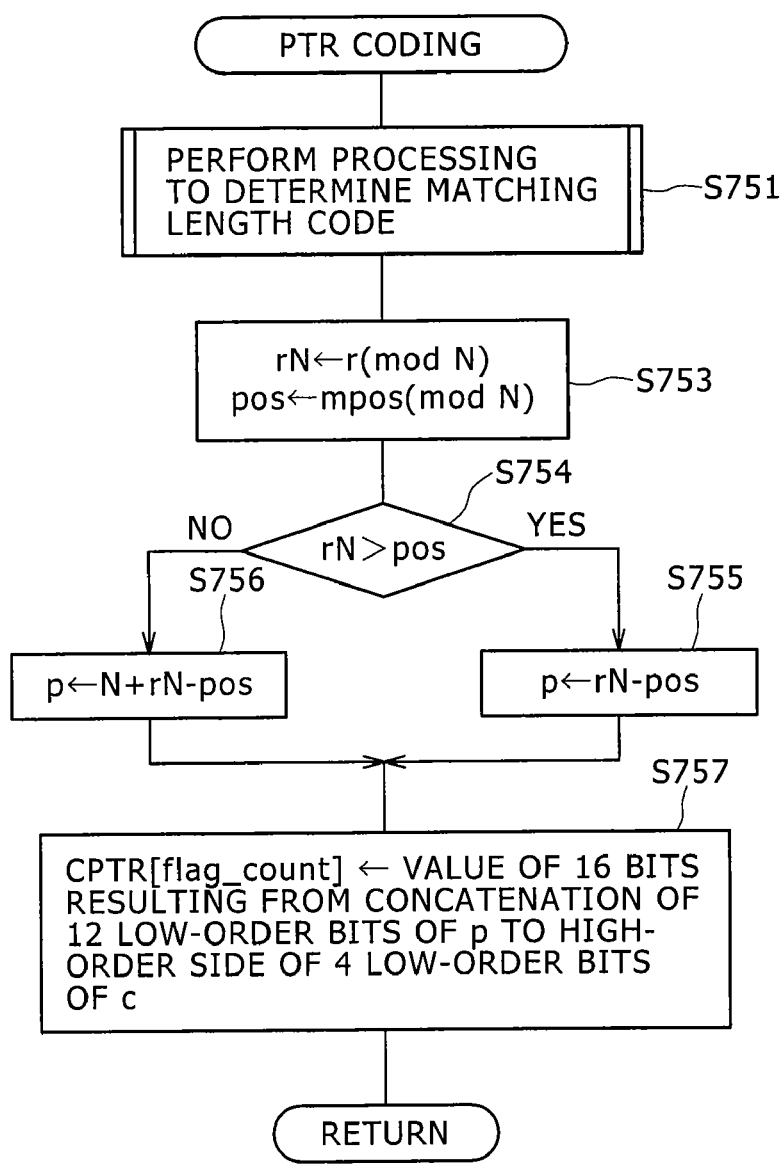
FIG. 13 shows a flowchart representing the procedure of PTR encoding processing carried out in accordance with an embodiment.

FIG. 13 shows a flowchart representing the procedure of PTR encoding processing carried out in accordance with an embodiment. The PTR encoding processing corresponds to the process carried out at the step S750 of the flowchart shown in FIG. 7 as a flowchart representing the coding processing.

In a process carried out at a step S751 to determine a matching-length code c, the matching-length code c is determined and the internal state transits from one to another as described above. Then, in a process carried out at the next step S753, a remainder obtained as a result of dividing the variable r by N is set in a variable rN. On the other hand, in a process carried out at the same step, a remainder obtained as a result of dividing the variable mpos by N is set in a variable pos. Then, if a determination result produced in a process carried out at the next step S754 indicates that the value of the variable rN is greater than the value of the variable pos, the flow of the processing goes on to a step S755 at which the value of the variable pos is subtracted from the value of the variable rN and a difference obtained as a result of the subtraction is set in the variable p. If the determination result produced in a process carried out at a step S754 indicates that the value of the variable rN is not greater than the value of the variable pos, on the other hand, the flow of the processing goes on to a step S756 at which the value of the variable pos is subtracted from the sum of N and the value of the variable rN and a difference obtained as a result of the subtraction is set in the variable p. In this way, the relative position of the head character of the matching character string in the slide window 211 is set in the variable P.

Then, in a process carried out at the next step S757, the value of 16 bits obtained as a result of concatenating the 12 low-order bits of the relative position p obtained as described above to the high-order side of the 4 low-order bits of the matching-length code c is set in an array element CPTR [flag_count]. The array CPTR [flag_count] is an array for holding PTR codes each corresponding to the value of the variable flag_count.

Figure 14:
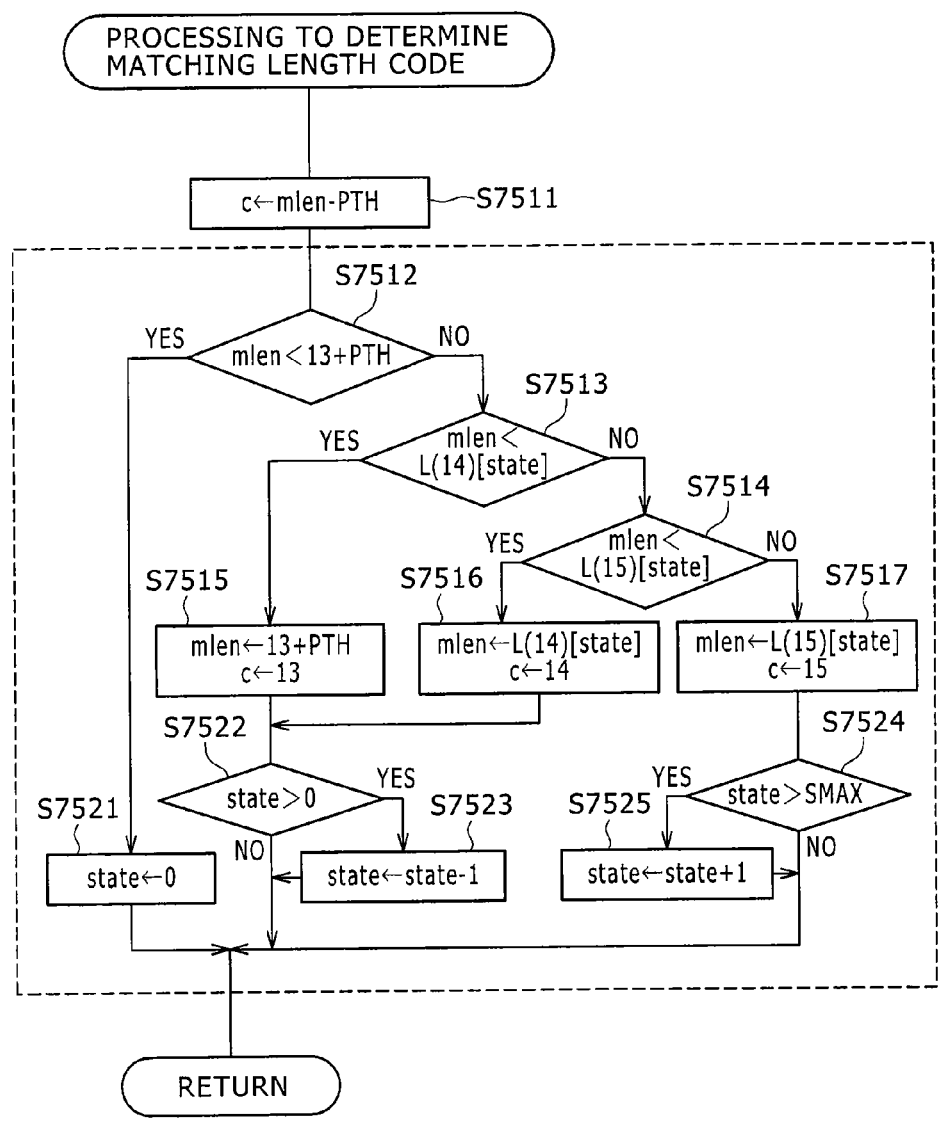
FIG. 14 shows a flowchart representing the procedure of processing carried out to determine a matching-length code in accordance with an embodiment.

FIG. 14 shows a flowchart representing the procedure of processing carried out in accordance with an embodiment to determine a matching-length code. The processing to determine a matching-length code corresponds to the process carried out at the step S751 of the flowchart shown in FIG. 13 as a flowchart representing the PTR coding processing.

As shown in the figure, the flowchart begins with a step S7511 at which a difference obtained as a result of subtracting a threshold value PTH from the maximum matching length mlen is set in the matching-length code c. A method adopted in the operation to set such a difference in the matching-length code c is the same one as the code assignment method for LZSS codes. In the case of this embodiment, if a determination result produced in a process carried out at the next step S7521 indicates that the maximum matching length mien is smaller than (13+PTH), this code assignment method is adopted. In this case, the flow of the processing goes on to a step S7521 at which the internal state is initialized to the state 0. In addition, as processing peculiar to the embodiment, the following processing is carried out.

If the determination result produced in the process carried out at the step S7521 indicates that the maximum matching length mlen is not smaller than (13+PTH), the flow of the processing goes on to a step S7513 to produce a result of determination as to whether or not the maximum matching length mien is smaller than L (14) [state]. If the result of the determination indicates that the maximum matching length mien is smaller than L (14) [state], the flow of the processing goes on to a step S7515 at which the maximum matching length mlen is set at (13+PTH) and the matching-length code c is determined to be 13. Then, the flow of the processing goes on to the next step S7522 to produce a result of determination as to whether or not the internal state is a state x where notation x denotes an integer greater than 0. If the result of the determination indicates that the internal state is a state x, the flow of the processing goes on to a step S7523 at which the internal state is driven to transit to a state y where notation y denotes an integer equal to (x−1).

If the determination result produced in the step S7513 indicates that the maximum matching length mlen is not smaller than L (14) [state], on the other hand, the flow of the processing goes on to a step S7514 to produce a result of determination as to whether or not the maximum matching length mlen is smaller than L (15) [state]. If a determination result produced in the process carried out at the step S7514 indicates that the maximum matching length mlen is smaller than L (15) [state], the flow of the processing goes on to a step S7516 at which the maximum matching length mlen is set at L (14) [state] and the matching-length code c is determined to be 14. Also in this case, the flow of the processing then goes on to the next step S7522 cited above. If a determination result produced in a process carried out at the step S7522 indicates that the internal state is a state x where notation x denotes an integer greater than 0, the flow of the processing goes on to the step S7523 at which the internal state is driven to transit to a state y where notation y denotes an integer equal to (x−1).

If a determination result produced in a process carried out at a step S7514 indicates that the maximum matching length mien is not smaller than L (15) [state], on the other hand, the flow of the processing goes on to a step S7517 at which the maximum matching length mien is set at L (15) [state] and the matching-length code c is determined to be 15. Then, the flow of the processing then goes on to a step S7524 to produce a result of determination as to whether or not the internal state is a state x where notation x denotes an integer smaller than the maximum value SMAX. If a determination result produced in a process carried out at a step S7524 indicates that the internal state is a state x, the flow of the processing goes on to a step S7525 at which the internal state is driven to transit to a state y where notation y denotes an integer equal to (x+1).

As described above, the matching-length code c is determined and the internal state is driven to transit from one to another.

Figure 15:
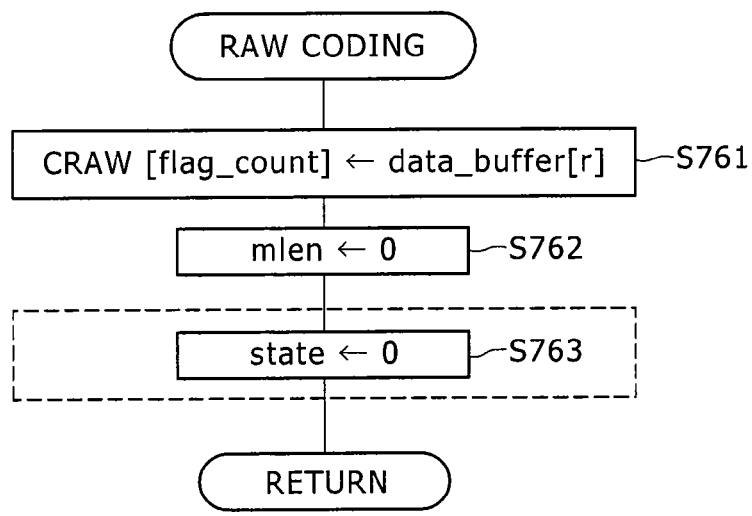
FIG. 15 shows a flowchart representing the procedure of RAW encoding processing carried out in accordance with an embodiment.

FIG. 15 shows a flowchart representing the procedure of RAW encoding processing carried out in accordance with an embodiment of the present invention. The RAW encoding processing corresponds to the process carried out at the step S760 of the flowchart shown in FIG. 7 as a flowchart representing the coding processing.

In this processing, character data is utilized. Thus, in a process carried out at the first step S761 of the flowchart, a character data_buffer element [r] immediately following the slide window 111 is set in an array element CRAW [flag_count]. The array CRAW [flag_count] is an array of RAW codes each corresponding to the value of a variable flag_count. In this case, the maximum matching length mien is set at 0 in a process carried out at the next step S762. In addition, as processing peculiar to the embodiment of the present invention, in a process carried out at the following step S763, the internal state is initialized to the state 0.

Figure 16:
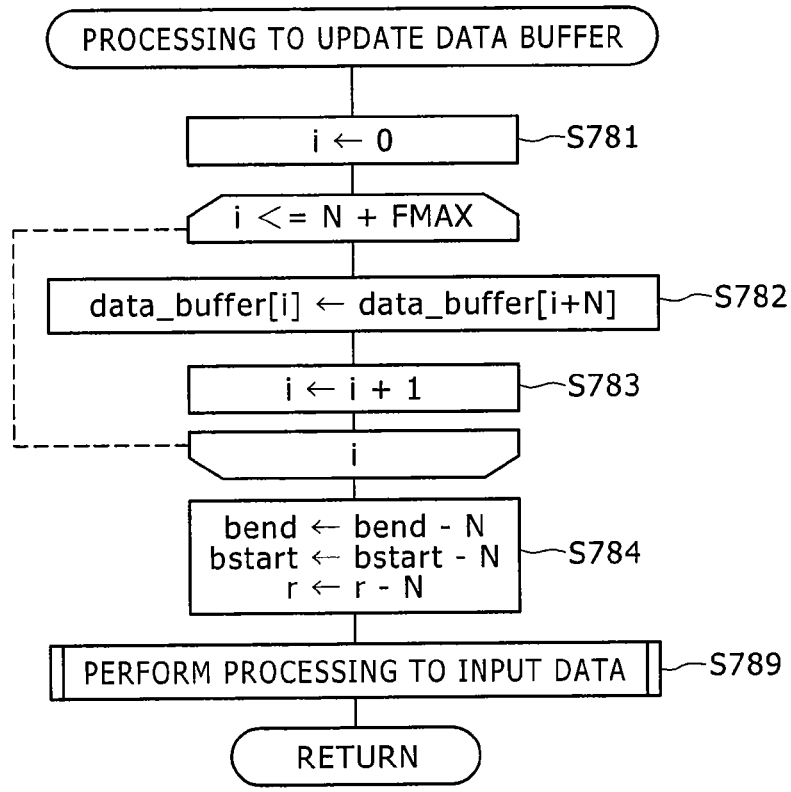
FIG. 16 shows a flowchart representing the procedure of processing carried out in accordance with an embodiment of the present invention to update a data buffer.

FIG. 16 shows a flowchart representing the procedure of processing carried out in accordance with an embodiment of the present invention to update a data buffer. The processing to update the data buffer corresponds to the process carried out at the step S780 of the flowchart shown in FIG. 7 as a flowchart representing the coding processing.

The flowchart shown in FIG. 16 begins with a step S781 at which a variable i is set at 0. Then, in a process carried out at the next step S782, the value of the data_buffer element [i+N] is moved to a data_buffer element [i]. Subsequently, in a process carried out at the next step S783, the value of the variable i is incremented by 1. The processes of the steps S782 and S783 are carried out repeatedly as long as the value of the variable i is equal to or smaller than [N+FMAX]. Then, in a process carried out at the next step S784, N is subtracted from the start address bstart of the effective area of the data buffer 110, from the end address bend of the effective area of the data buffer 110 and from the variable r. In this way, the slide window 111 is shifted back in a direction toward the left end by a distance corresponding to N, being positioned as shown in FIG. 6 (d). Subsequently, in a process carried out at the next step S789, input data is read into the remaining portion of the data buffer 110 in the data input processing explained earlier by referring to the flowchart shown in FIG. 10.

Figure 17:
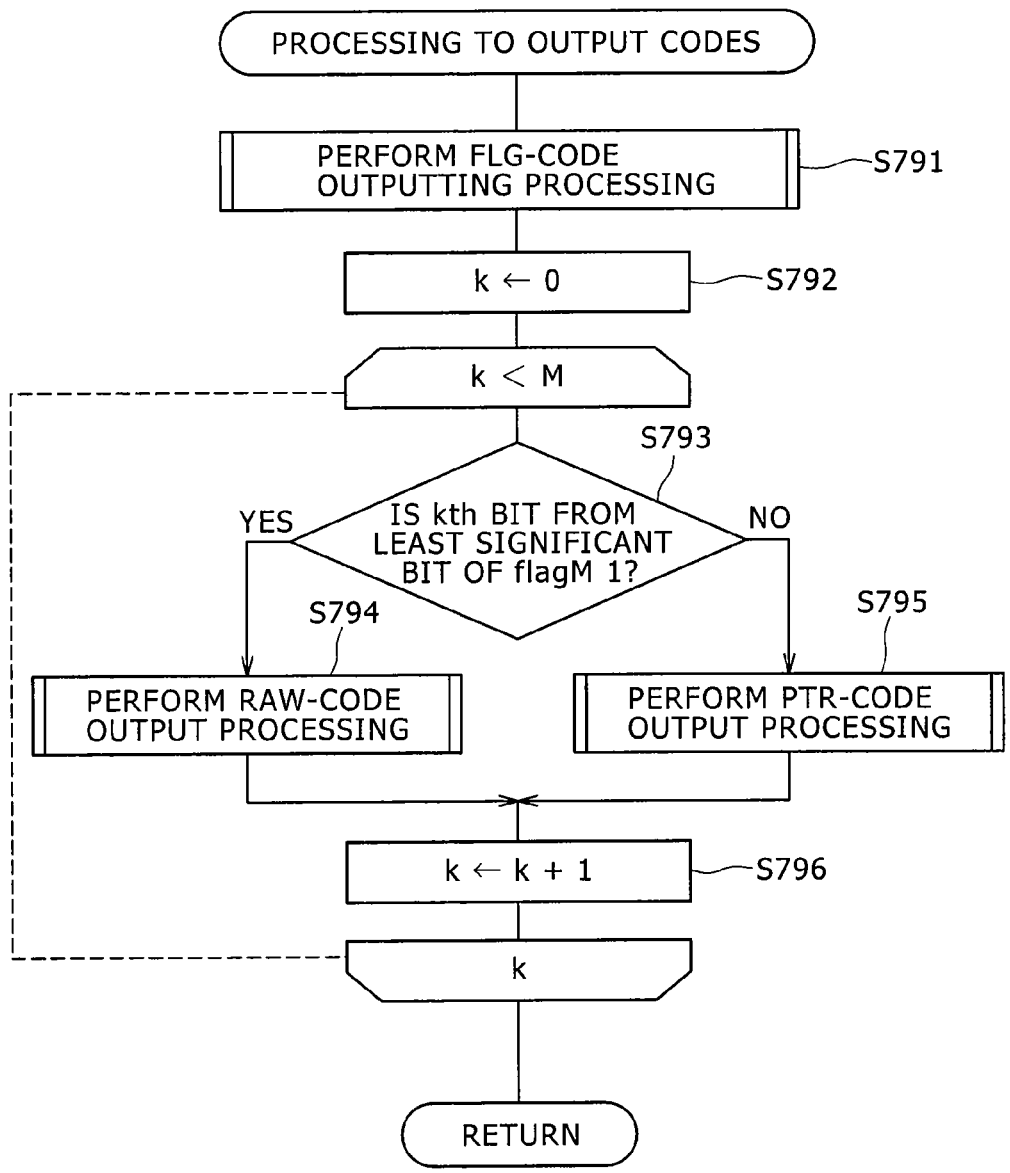
FIG. 17 shows a flowchart representing the procedure of processing carried out in accordance with an embodiment to output codes.

FIG. 17 shows a flowchart representing the procedure of processing carried out in accordance with an embodiment of the present invention to output codes. The processing to output codes corresponds to the processes carried out at the steps S770 to S790 of the flowchart shown in FIG. 7 as a flowchart representing the coding processing.

The flowchart shown in FIG. 17 begins with a step S791 at which FLG sub-code outputting processing is performed. Then, in a process carried out at the next step S792, a variable k is reset to 0. Subsequently, if a determination result produced in a process carried out at the next step S793 indicates that the kth bit of flgM from the least significant bit is 1, the flow of the processing goes on to a step S794 at which a RAW code is output. If a determination result produced in a process carried out at the next step S794 indicates that the kth bit of flgM from the least significant bit is 0, on the other hand, the flow of the processing goes on to a step S795 at which a PTR code is output. Then, in a process carried out at the steps S796, the variable k is incremented by 1. The processes of the steps S793, S794 (or S795) and S796 are carried out repeatedly as long as the variable k is smaller than M.

Figure 18:
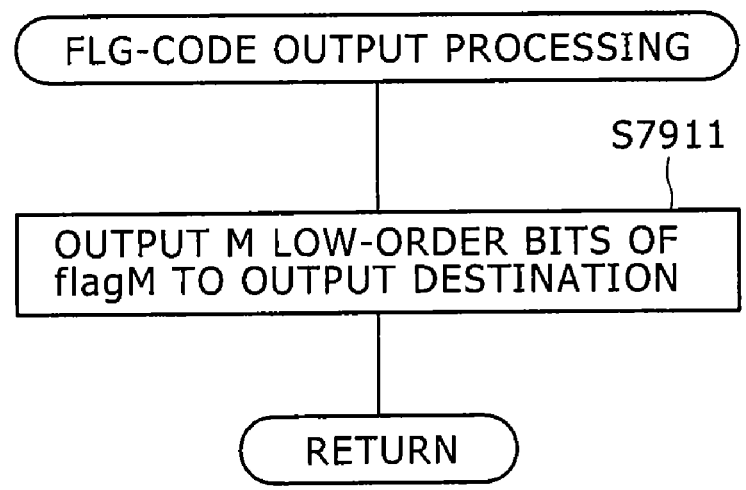
FIG. 18 shows a flowchart representing the procedure of FLG sub-code outputting processing carried out in accordance with an embodiment.

FIG. 18 shows a flowchart representing the procedure of processing carried out in accordance with an embodiment to output FLG sub-codes. The processing to output FLG sub-codes corresponds to the process carried out at the step S791 of the flowchart shown in FIG. 17 as a flowchart representing processing to output codes. In a process carried out at a step S7911 of the flowchart shown in FIG. 18, M low-order bits of flgM are output to an output destination.

Figure 19:
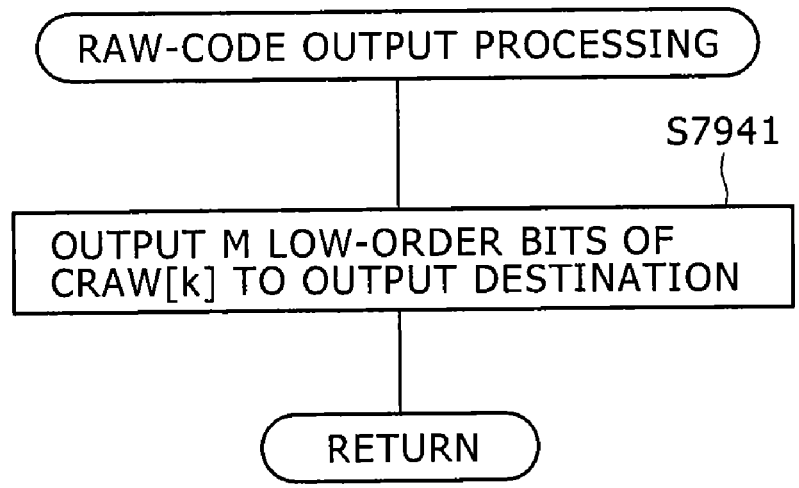
FIG. 19 shows a flowchart representing the procedure of RAW-code outputting processing carried out in accordance with an embodiment.

FIG. 19 shows a flowchart representing the procedure of RAW-code outputting processing carried out in accordance with an embodiment. The RAW-code outputting processing corresponds to the process carried out at the step S794 of the flowchart shown in FIG. 17 as a flowchart representing processing output codes. In a process carried out at a step S7941 of the flowchart shown in FIG. 19, M low-order bits of an array element CRAW [k] are output to an output destination.

Figure 20A:
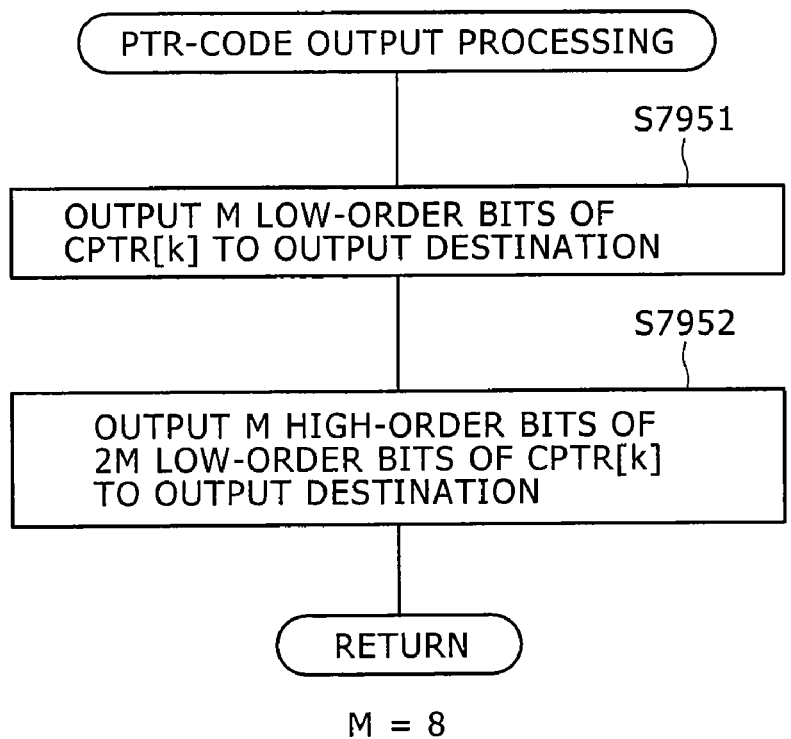
FIGS. 20A and 20B show flowcharts representing the procedure of PTR-code outputting processing carried out in accordance with an embodiment of the present invention.
Figure 20B:
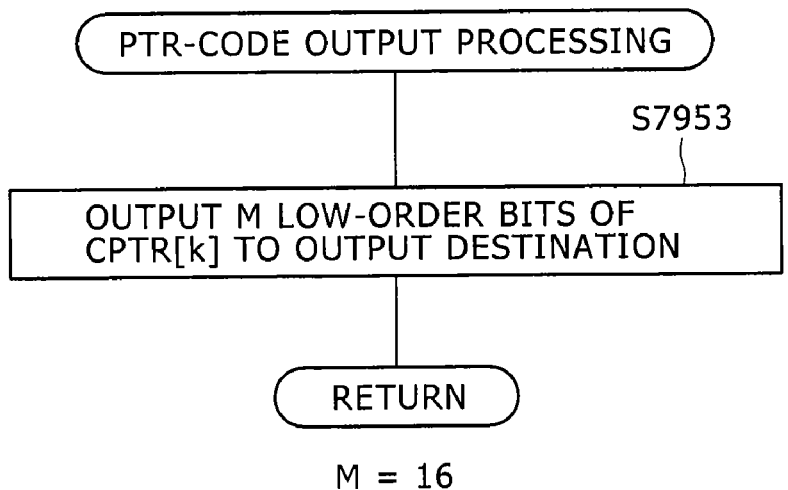

FIG. 20 shows a flowchart representing the procedure of PTR-code outputting processing carried out in accordance with an embodiment. The PTR-code outputting processing corresponds to the process carried out at the step S795 of the flowchart shown in FIG. 17 as a flowchart representing processing to output codes.

The PTR-code outputting processing carried out for M=8 is different from the PTR-code outputting processing carried out for M=16. In the case of the PTR-code outputting processing carried out for M=8, in a process carried out at a step S7951 of the flowchart shown in FIG. 20, M low-order bits of an array element CPTR [k] are output to an output destination. Then, in a process carried out at the next step S7952 of the flowchart shown in FIG. 20, M high-order bits of 2M low-order bits of the array element CPTR [k] are output to an output destination. In the case of the PTR-code outputting processing carried out for M=16, on the other hand, in a process carried out at a step S7953 of the flowchart shown in FIG. 20, the M low-order bits of the array element CPTR [k] are output to an output destination.

As described above, input data is coded into a string of codes. In a process to decode a code string obtained as a result of the coding process described above, it is possible to adopt one of two conceivable methods. In accordance with one of the methods, the entire string of codes is decoded in a single process. In accordance with the other method, on the other hand, the string of codes is decoded in block units, which are each B characters in the string of codes.

Figure 21:
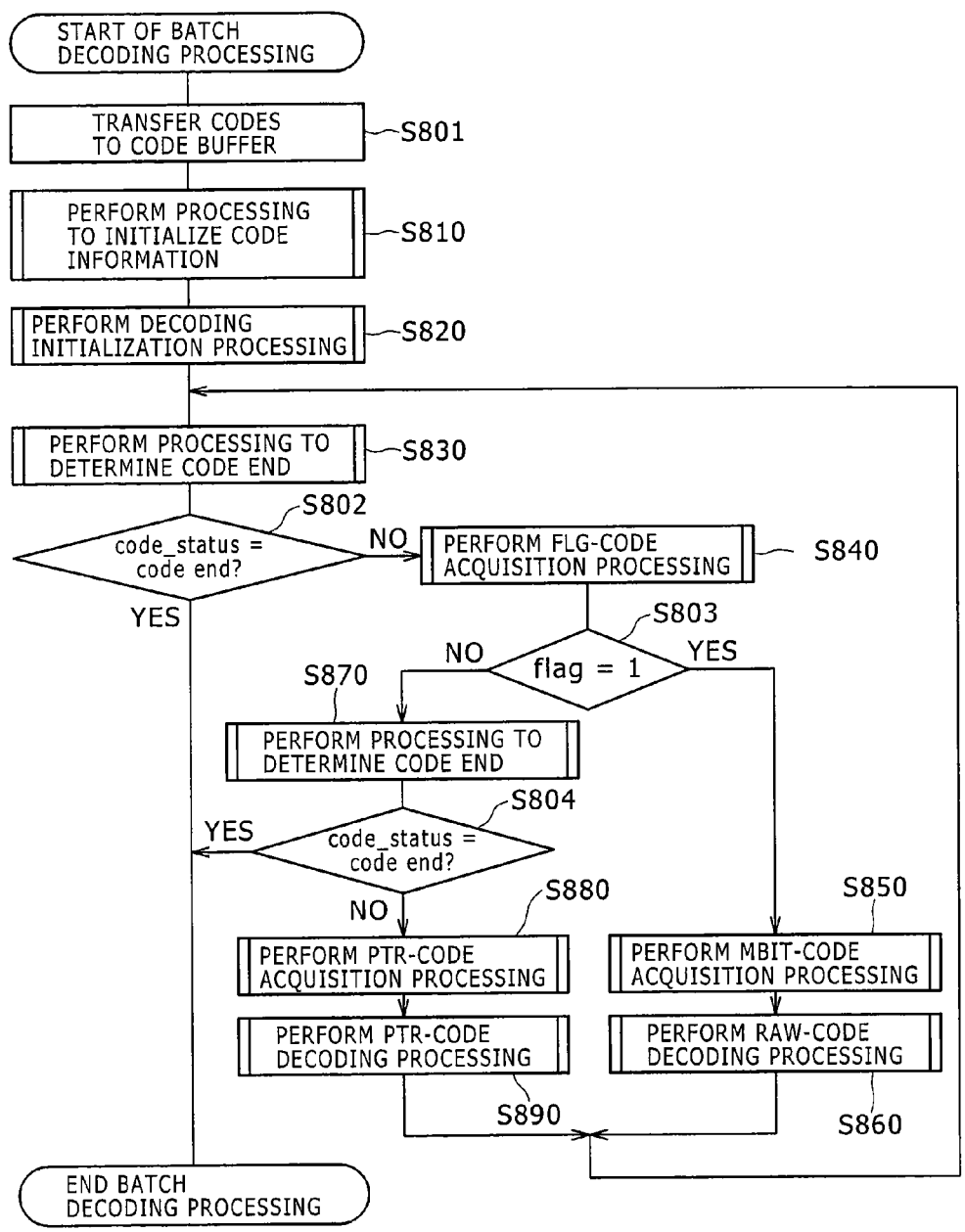
FIG. 21 shows a flowchart illustrating the main stream of batch decoding processing carried out in accordance with an embodiment of the present invention.

FIG. 21 shows a flowchart illustrating the main stream of batch decoding processing carried out in accordance with an embodiment. As shown in the figure, the flowchart begins with a step S801 at which a string of codes is transferred to the code buffer 210. Then, in a process carried out at the next step S810, information on codes is initialized. Subsequently, in a process carried out at the next step S820, variables for a decoding purpose are initialized. Then, processes of a step S830, a step S802 following the step S830 and steps following the step S802 are carried out repeatedly till the end of codes to be decoded is detected.

The steps following the step S802 begins with a step S840 at which the FLG sub-code (or a variable flag) is fetched. Then, the flow of the processing goes on to a step S803 to produce a result of determination as to whether the variable flag is 0 or 1. The variable flag having a value of 1 indicates that the code being decoded is a RAW code. In this case, the flow of the processing goes on to a step S850 at which a RAW code having a length of M bits is obtained. Then, in a process carried out at the next step S860, the RAW code is decoded. On the other hand, the variable flag having a value of 0 indicates that the code being decoded is a PTR code. In this case, at a step S880, a PTR code is fetched. Then, in a process carried out at the next step S890, the PTR code is decoded. It is to be noted that, in processes carried out at steps S870 and S804, which precede the process performed at the step S880 to fetch the PTR code, the code being decoded is examined to determine whether or not the code is the code end.

Figure 22:
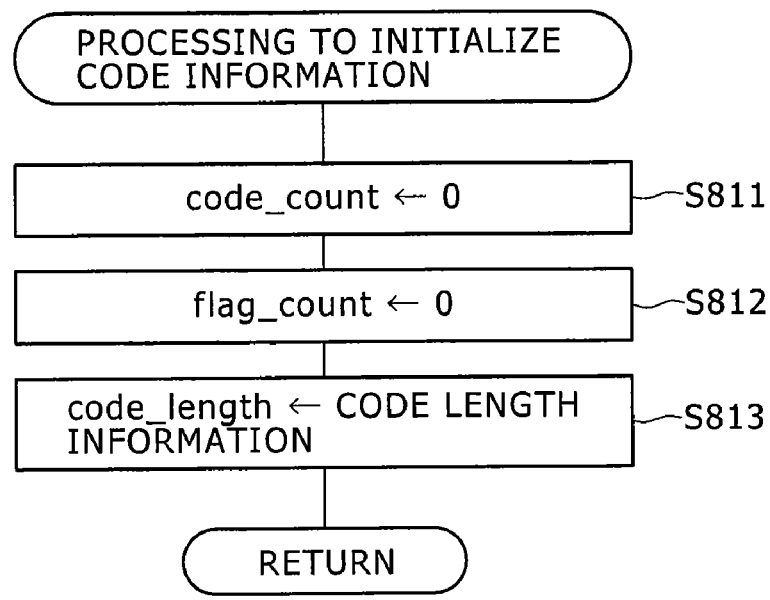
FIG. 22 shows a flowchart representing the procedure of processing carried out in accordance with an embodiment to initialize information on codes.

FIG. 22 shows a flowchart representing the procedure of processing carried out in accordance with an embodiment of the present invention to initialize information on codes. The processing to initialize information on codes corresponds to a process carried out at the step S810 of the flowchart shown in FIG. 21 as a flowchart representing the batch decoding processing and a process carried out at a step S910 of a flowchart shown in FIG. 33 as a flowchart representing division decoding processing to be described later.

The flowchart shown in FIG. 22 begins with a step begins with a step S811 at which a variable code_count for counting the number of codes already processed is reset to 0. Then, in a process carried out at the next step S812, a variable flag_count for counting the number of FLG sub-codes is also reset to 0. Subsequently, in a process carried out at the next step S813, the total length of codes to be decoded is set in a variable code_length. It is to be noted that the total length of codes to be decoded is the number of characters included in the string of codes as characters each having a length of M bits.

Figure 23:
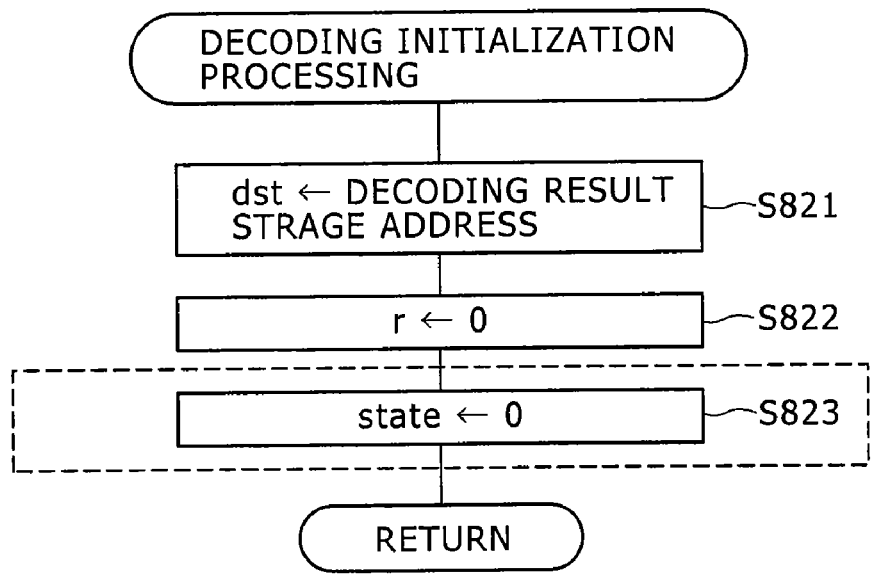
FIG. 23 shows a flowchart representing the procedure of decoding initialization processing carried out in accordance with an embodiment.

FIG. 23 shows a flowchart representing the procedure of decoding initialization processing carried out in accordance with an embodiment. The decoding initialization processing corresponds to a process carried out at the step S820 of the flowchart shown in FIG. 21 as a flowchart representing the batch decoding processing and a process carried out at a step S920 of the flowchart shown in FIG. 33 as a flowchart representing the aforementioned division decoding processing to be described later.

The flowchart shown in FIG. 23 begins with a step S821 at which the address of an array dst used for storing data obtained as a result of the decoding processing is set. Then, in a process carried out at the next step S822, a variable r used for storing the position of the head character of a decoding object is reset to 0. Subsequently, in a process carried out at the next step S823, the internal state is initialized to the state 0.

Figure 24:
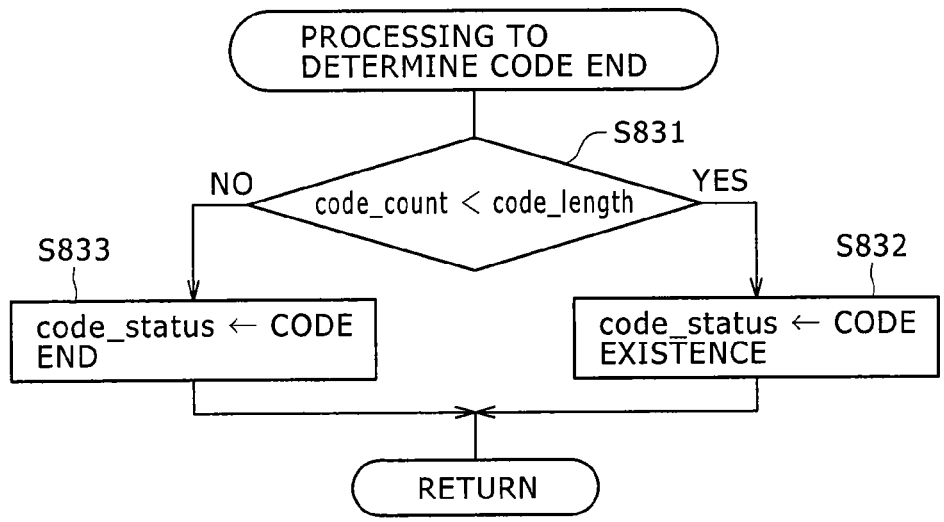
FIG. 24 shows a flowchart representing the procedure of processing carried out in accordance with an embodiment to determine a code end.

FIG. 24 shows a flowchart representing the procedure of processing carried out in accordance with an embodiment to determine a code end. The processing to determine a code end corresponds to a process carried out at the step S830 or S870 of the flowchart shown in FIG. 21 as a flowchart representing the batch decoding processing and a process carried out at the step S930 of a flowchart shown in FIG. 34 as a flowchart representing division decoding processing to be described later.

The flowchart shown in FIG. 24 begins with a step S831 at which the variable code_count is compared with the variable code_length to produce a result of determination as to whether or not the value of the variable code_count is smaller than the value of the variable code_length. If the result of the determination indicates that the value of the variable code_count is smaller than the value of the variable code_length, the flow of the processing goes on to a step S832 at which a variable code_status is set at a value indicating that there is still a code remaining to be decoded. If the result of the determination indicates that the value of the variable code_count is equal to or greater than the value of the variable code_length, on the other hand, the flow of the processing goes on to a step S833 at which a variable code_status is set at a value indicating that the decoding processing has been completed. That is to say, by counting the number of already decoded codes, it is possible to determine whether of not the decoding processing has been completed.

Figure 25:
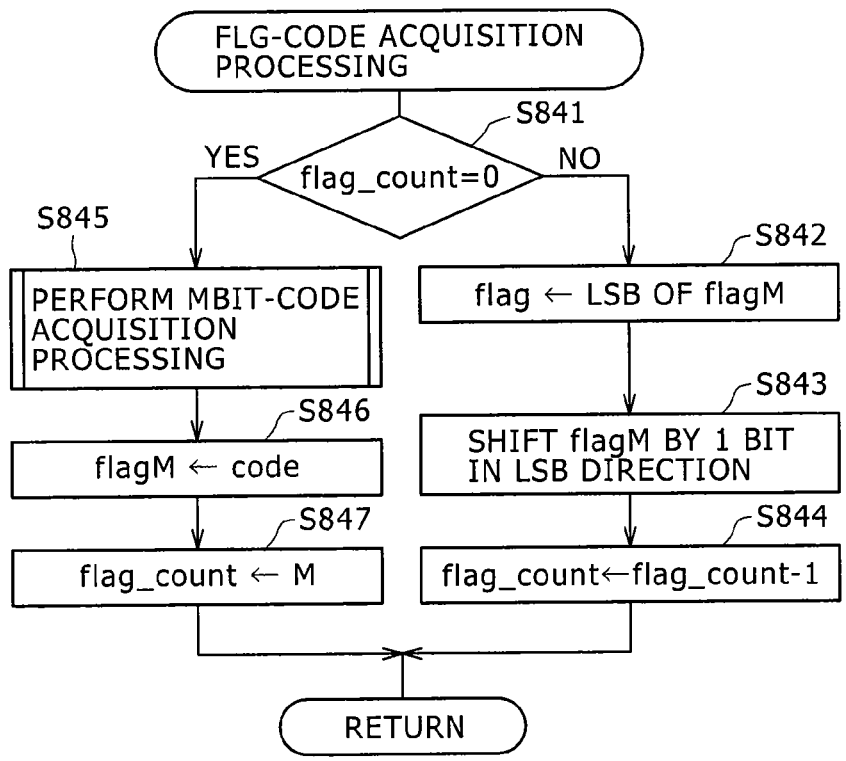
FIG. 25 shows a flowchart representing the procedure of FLG sub-code acquisition processing carried out in accordance with an embodiment.

FIG. 25 shows a flowchart representing the procedure of FLG sub-code acquisition processing carried out in accordance with an embodiment of the present invention. The FLG sub-code acquisition processing corresponds to a process carried out at the step S840 of the flowchart shown in FIG. 21 as a flowchart representing the batch decoding processing and a process carried out at a step S940 of a flowchart shown in FIG. 34 as a flowchart representing the aforementioned division decoding processing to be described later.

The flowchart shown in FIG. 25 begins with a step S841 to produce a result of determination as to whether or not the value of the variable flag_count is 0. If the result of the determination indicates that the value of the variable flag_count is not 0, the flow of the processing goes on to a step S842 at which the value of the LSB of the variable flagM is set in the variable flag. Then, in a process carried out at the next step S843, the variable flagM is shifted in a direction toward the LSB by 1 bit. Subsequently, in a process carried out at the next step S844, the variable flag_count is decremented by 1.

If the determination result produced in the process carried out at the step S841 indicates that the value of the variable flag_count is 0, on the other hand, the flow of the processing goes on to a step S845 at which a code with a length of M bits is acquired as a variable code. Then, in a process carried out at the next step S846, the acquired value of the variable code is transferred to the variable flagM. Subsequently, in a process carried out at the next step S847, the value M is set in the variable flag_count.

Figure 26:
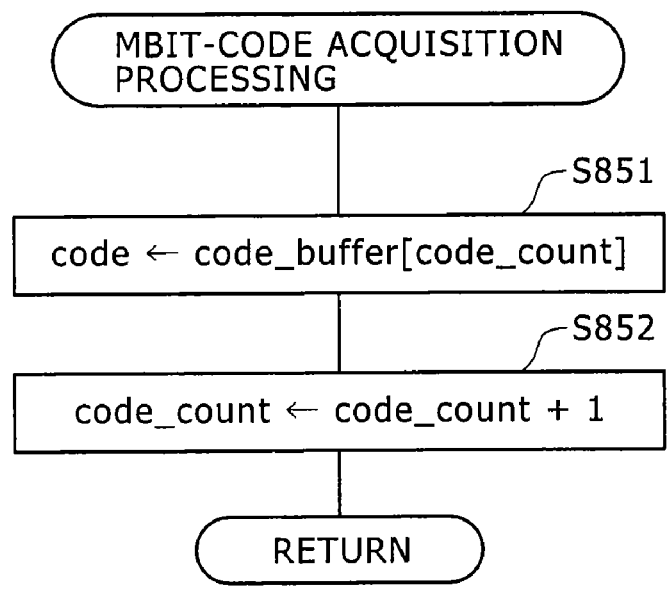
FIG. 26 shows a flowchart representing the procedure of processing carried out to acquire a code with a length of M bits in accordance with an embodiment.

FIG. 26 shows a flowchart representing the procedure of processing carried out in accordance with an embodiment of the present invention to acquire a code having a length of M bits. The processing to acquire a code having a length of M bits corresponds to a process carried out at the step S850 of the flowchart shown in FIG. 21 as a flowchart representing the batch decoding processing and a process carried out at the step S845 of the flowchart shown in FIG. 25 as a flowchart representing the FLG sub-code acquisition processing.

The flowchart shown in FIG. 26 begins with a step S851 at which an element included in a code_buffer [code_count] existing in the data buffer 110 as an element pointed to by a variable code_count is set in the variable code. Then, in a process carried out at the next step S852, the variable code_count is incremented by 1.

Figure 27:
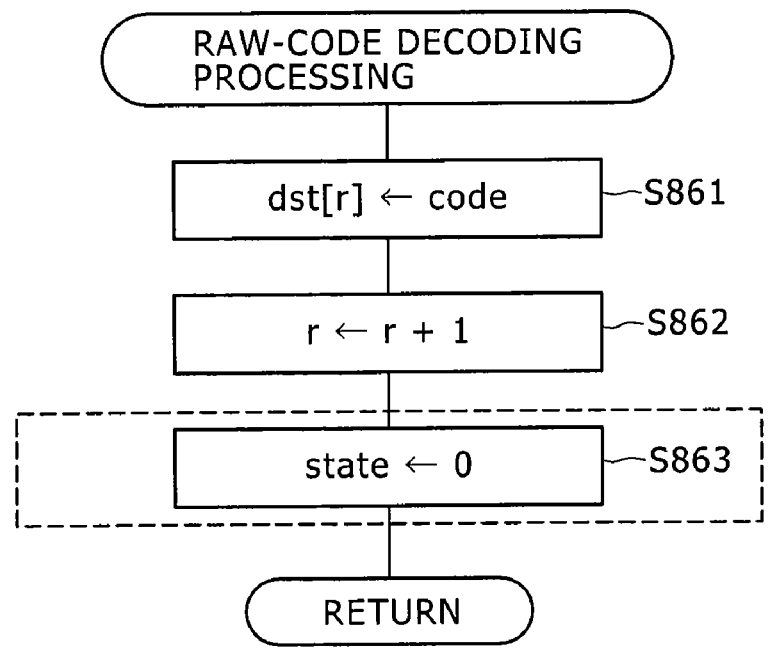
FIG. 27 shows a flowchart representing the procedure of processing carried out to decode a RAW code in accordance with an embodiment.

FIG. 27 shows a flowchart representing the procedure of processing carried out in accordance with an embodiment of the present invention to decode a RAW code. The processing to acquire a RAW code corresponds to a process carried out at the step S860 of the flowchart shown in FIG. 21 as a flowchart representing the batch decoding processing and processes carried out at steps S9792 and S9782 of flowcharts shown in FIG. 38 as flowcharts each representing selective decoding processing to be described later.

The flowchart shown in FIG. 27 begins with a step S861 at which the contents of the variable code are set in a data storage array element dst [r] pointed to by a variable r. Then, in a process carried out at the next step S862, the variable r is incremented by 1. Subsequently, in a process carried out at the next step S863, the internal state is initialized to the state 0.

Figure 28A:
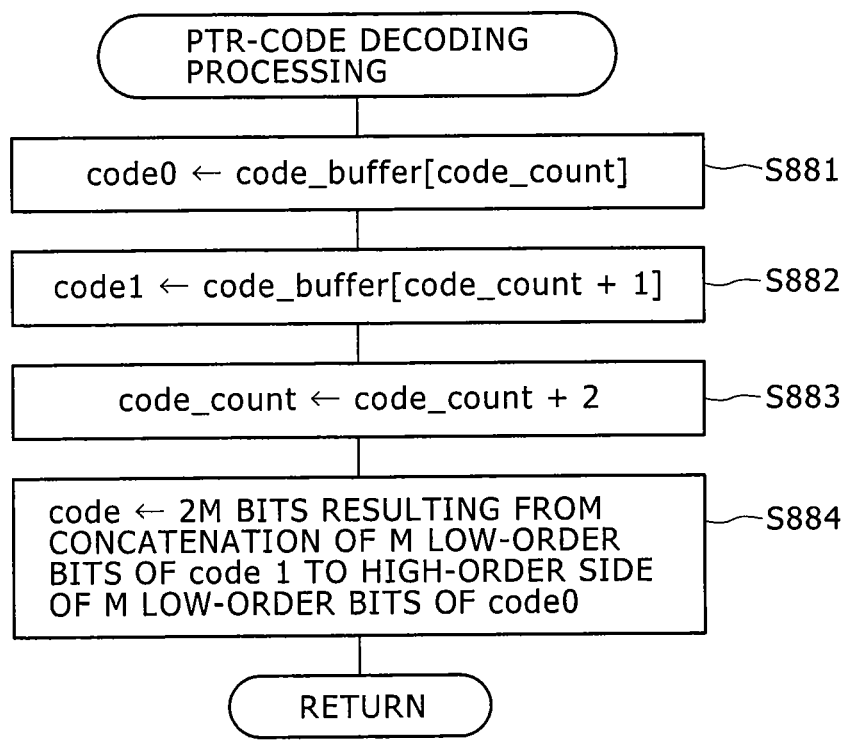
FIGS. 28A and 28B show flowcharts each representing the procedure of processing carried out to acquire a PTR code in accordance with an embodiment.
Figure 28B:
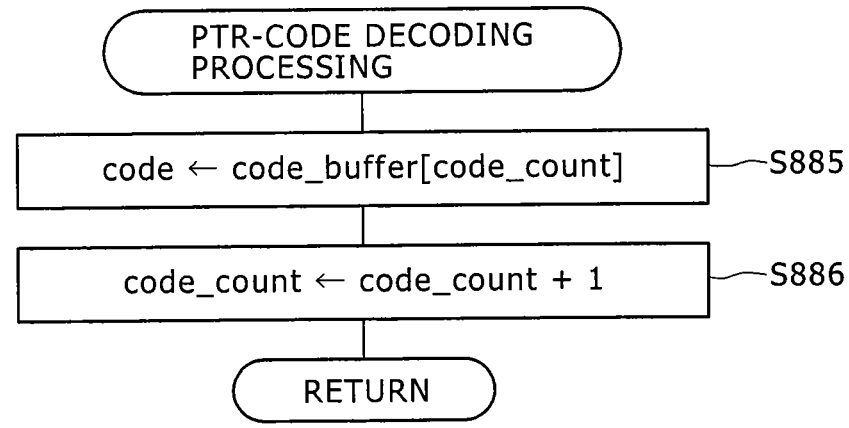

FIG. 28 shows flowcharts each representing the procedure of processing carried out in accordance with an embodiment of the present invention to acquire a PTR code. The processing to acquire a PTR code corresponds to a process carried out at the step S880 of the flowchart shown in FIG. 21 as a flowchart representing the batch decoding processing.

The PTR-code acquisition processing may be carried out for M=8 and M=16. The processing to acquire a PTR code is carried out for M=8 in a way different from the PTR-code acquisition processing carried out for M=16 as follows. In the case of the PTR-code acquisition processing carried out for M=8, first of all, in a process carried out at a step S881, the value of the element code_buffer [code_count] is set in a variable code 0. Then, in a process carried out at the next step S882, the value of the element code_buffer [code_count+1] is set in a variable code 1. Subsequently, in a process carried out at the next step S883, the variable code_count is incremented by 2. Then, in a process carried out at the next step S884, 2M bits obtained as a result of concatenating M low-order bits of code 1 to the high-order side of M low-order bits of code 0 are set in a variable code.

In the case of the PTR-code acquisition processing carried out for M=16, on the other hand, first of all, in a process carried out at a step S885, the value of the element code_buffer [code_count] is set in the variable code. Subsequently, in a process carried out at the next step S886, the variable code_count is incremented by 1.

Figure 29:
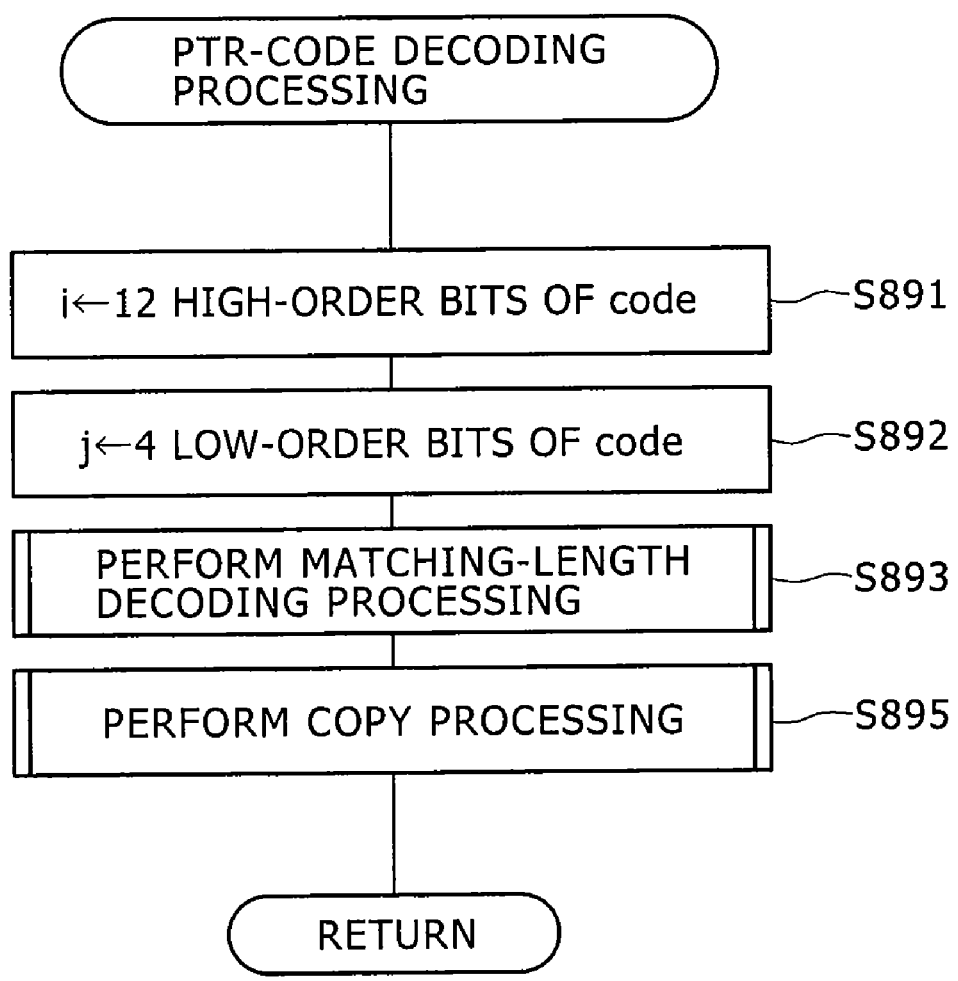
FIG. 29 shows a flowchart representing the procedure of processing carried out to decode a PTR code in accordance with an embodiment.

FIG. 29 shows a flowchart representing the procedure of processing carried out in accordance with an embodiment of the present invention to decode a PTR code. The processing to decode a PTR code corresponds to a process carried out at the step S890 of the flowchart shown in FIG. 21 as a flowchart representing the batch decoding processing and processes carried out at steps S9797 and S9787 of the flowcharts shown in FIG. 38 as the flowcharts each representing the selective decoding processing.

The flowchart shown in FIG. 29 begins with a step S891 at which the 12 high-order bits of the variable code are set in a variable i. Then, in a process carried out at the next step S892, the 4 low-order bits of the variable code are set in a variable j. Subsequently, in a process carried out at the next step S893, the matching-length code is decoded. Finally, in a process carried out at the next step S895, the coded sub-string of characters is decoded by a carrying out a copying process.

Figure 30:
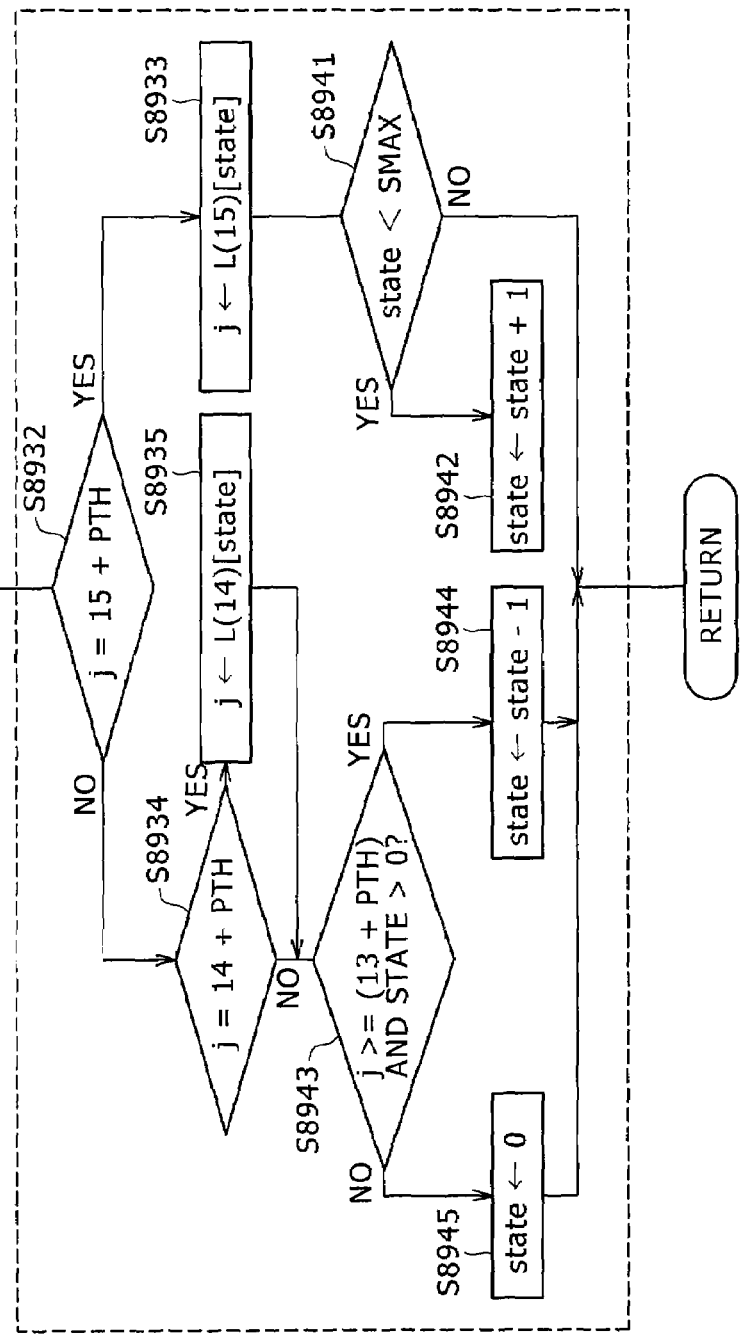
FIG. 30 shows a flowchart representing the procedure of processing carried out in accordance with an embodiment to decode a matching length.

FIG. 30 shows a flowchart representing the procedure of processing carried out in accordance with an embodiment of the present invention to decode a matching length. The processing to decode a matching length corresponds to a process carried out at the step S893 of the flowchart shown in FIG. 29 as a flowchart representing the PTR-code decoding processing.

The flowchart shown in FIG. 30 begins with a step S8931 at which a sum of the matching-length code c represented by the value of a variable j and the threshold value PTH is set in the variable j. In this way, the value of the expression (matching length len−1) is set in the variable j by adoption of the same decoding method as the LZSS code. In the case of the embodiment of the present invention, for a matching-length code c not greater than 13, this decoding method is adopted to assign a matching length len to the matching-length code c. The following processes carried out at subsequent steps following the step S8931 are processes peculiar to the embodiment.

Subsequently, in a process carried out at the next step S8932, the value of the variable j is examined in order to produce a result of determination as to whether or not the value is equal to the value of the expression (15+PTH). If the result of the determination indicates that the value of the variable j is equal to the value of the expression (15+PTH), the flow of the processing goes on to a step S8933 at which the value of L (15) [state] is set in the variable j. Then, the flow of the processing goes on to a step S8941 to produce a result of determination as to whether or not the number of the internal state is smaller than the maximum value SMAX. If the result of the determination indicates that the number of the internal state is smaller than the maximum value SMAX, the flow of the processing goes on to a step S8942 at which the number of the internal state is incremented by 1.

If the determination result produced in a process carried out at the step S8932 indicates that the value of the variable j is not equal to the value of the expression (15+PTH), on the other hand, the flow of the processing goes on to a step S8934 at which the value of the variable j is examined in order to produce a result of determination as to whether or not the value of the variable j is equal to the value of the expression (14+PTH). If the result of the determination indicates that the value of the variable j is equal to the value of the expression (14+PTH), the flow of the processing goes on to a step S8935 at which the value of L (14) [state] is set in the variable j. Then, the flow of the processing goes on to a step S8943.

If the determination result produced in a process carried out at the step S8934 indicates that the value of the variable j is not equal to the value of the expression (14+PTH), on the other hand, the flow of the processing goes on to the step S8943 to produce a result of determination whether or not the value of the variable j is at least equal to the value of the expression (13+PTH) and the number of the internal state is greater than 0. If the result of the determination indicates that the value of the variable j is at least equal to the value of the expression (13+PTH) and the number of the internal state is greater than 0, the flow of the processing goes on to a step S8944 at which the number of the internal state is decremented by 1. Otherwise, the flow of the processing goes on to a step S8945 at which the number of the internal state is initialized to 0.

By carrying out the processing to decode a matching length as described above, the value of the expression (matching length−1) is set in the variable j and the internal state is driven to transit to another value.

Figure 31:
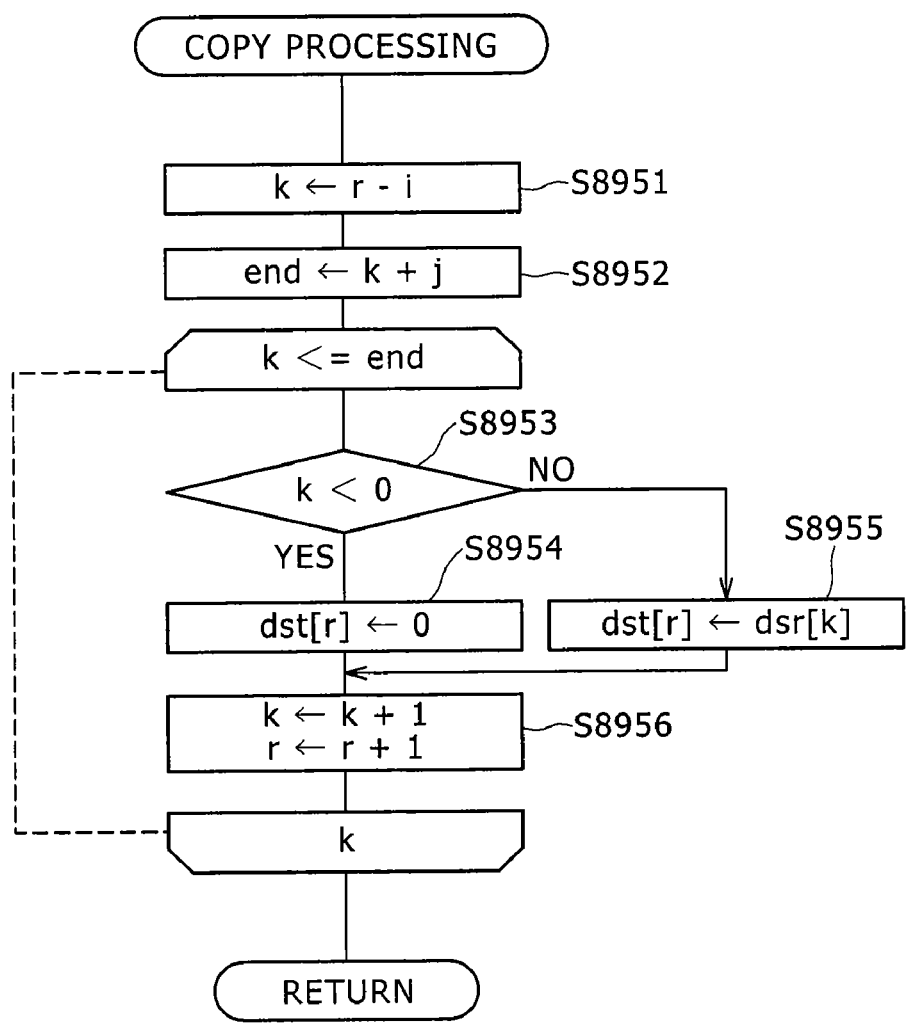
FIG. 31 shows a flowchart representing the procedure of copy processing carried out in accordance with an embodiment.

FIG. 31 shows a flowchart representing the procedure of copy processing carried out in accordance with an embodiment. The copy processing corresponds to the process carried out at the step S895 of the flowchart shown in FIG. 29 as a flowchart representing the PTR-code decoding processing.

The flowchart shown in FIG. 31 begins with a step S8951 at which a difference obtained as a result of subtracting the value of a variable i from the value of a variable r is set in a variable k. Then, in a process carried out at the next step S8952, a sum obtained as a result of adding the value of a variable j to the value of a variable k is set in a variable end. In this way, the position of the head character of a character sub-string to be copied is set in the variable k and the position of the tail character of the character sub-string to be copied is set in the variable end.

Then, in a process carried out at the next step S8953, the value of the variable k is examined in order to produce a result of determination as to whether or not the value is equal to 0. If the result of the determination indicates that the value of the variable k is equal to 0, the flow of the processing goes on to a step S8954 at which an array element dst [r] is reset to 0. If the result of the determination indicates that the value of the variable k is not equal to 0, on the other hand, the flow of the processing goes on to a step S8955 at which the value of an array element dst [k] is copied to the array element dst [r]. In either case, the flow of the processing goes on to a step S8956 at which the values of the variables k and r are each incremented by 1. The processes of the step S8953, the step S8954 or S8955 and the step S8956 are carried out repeatedly as long as the value of the variable k is not greater than the value of the variable end.

The batch decoding processing of a code string is carried out as described above. The following description explains division decoding processing to decode a string of codes in block units, which are each composed of B characters included in the string.

Figure 32:
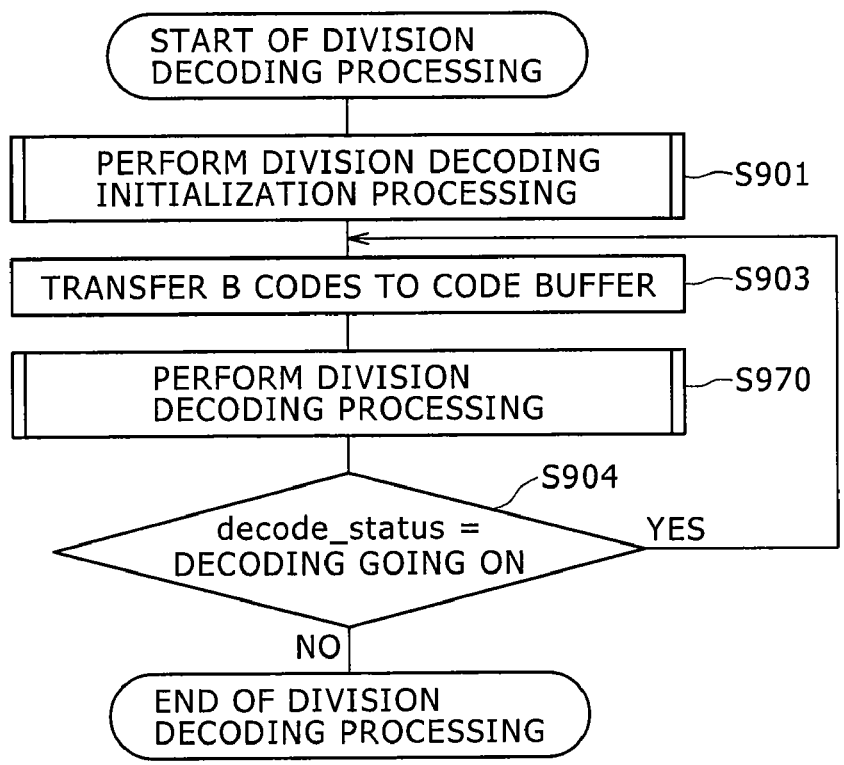
FIG. 32 shows a flowchart representing the main stream of division decoding processing carried out in accordance with an embodiment.

FIG. 32 shows a flowchart representing the main stream of division decoding processing carried out in accordance with an embodiment. As shown in the figure, the flowchart begins with a step S901 at which division decoding initialization processing is carried out. Then, in a process carried out at the next step S903, B successive codes are transferred to the code buffer 210. Subsequently, in a process carried out at the next step S970, division decoding processing is carried out on the B codes. The processes of the steps S903 and S970 are carried out repeatedly as long as a determination result produced in a process carried out at a step S904 indicates that a block remains to be decoded.

Figure 33:
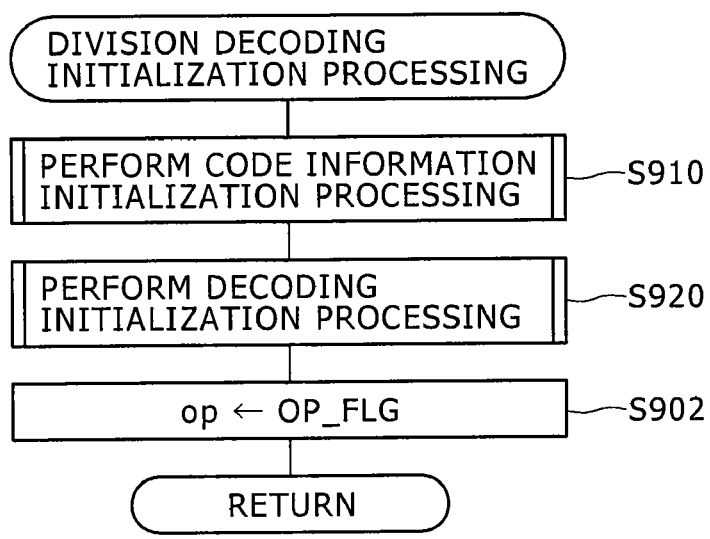
FIG. 33 shows a flowchart representing the procedure of division decoding initialization processing carried out in accordance with an embodiment.

FIG. 33 shows a flowchart representing the procedure of division decoding initialization processing carried out in accordance with an embodiment of the present invention. The division decoding initialization processing corresponds to a process carried out at the step S901 of the flowchart shown in FIG. 32 as a flowchart representing the main stream of the division decoding processing.

The flowchart shown in FIG. 33 begins with a step S910 at which information on codes is initialized in the same way as the batch decoding processing represented by the flowchart shown in FIG. 21. Then, in a process carried out at the next step S920, variables for decoding are initialized. Subsequently, in a process carried out at the next step S902, a value OP_FLG indicating that a process to acquire FLG sub-codes is to be carried out is set in a variable op used for holding information on a process to be carried out next.

Figure 34:
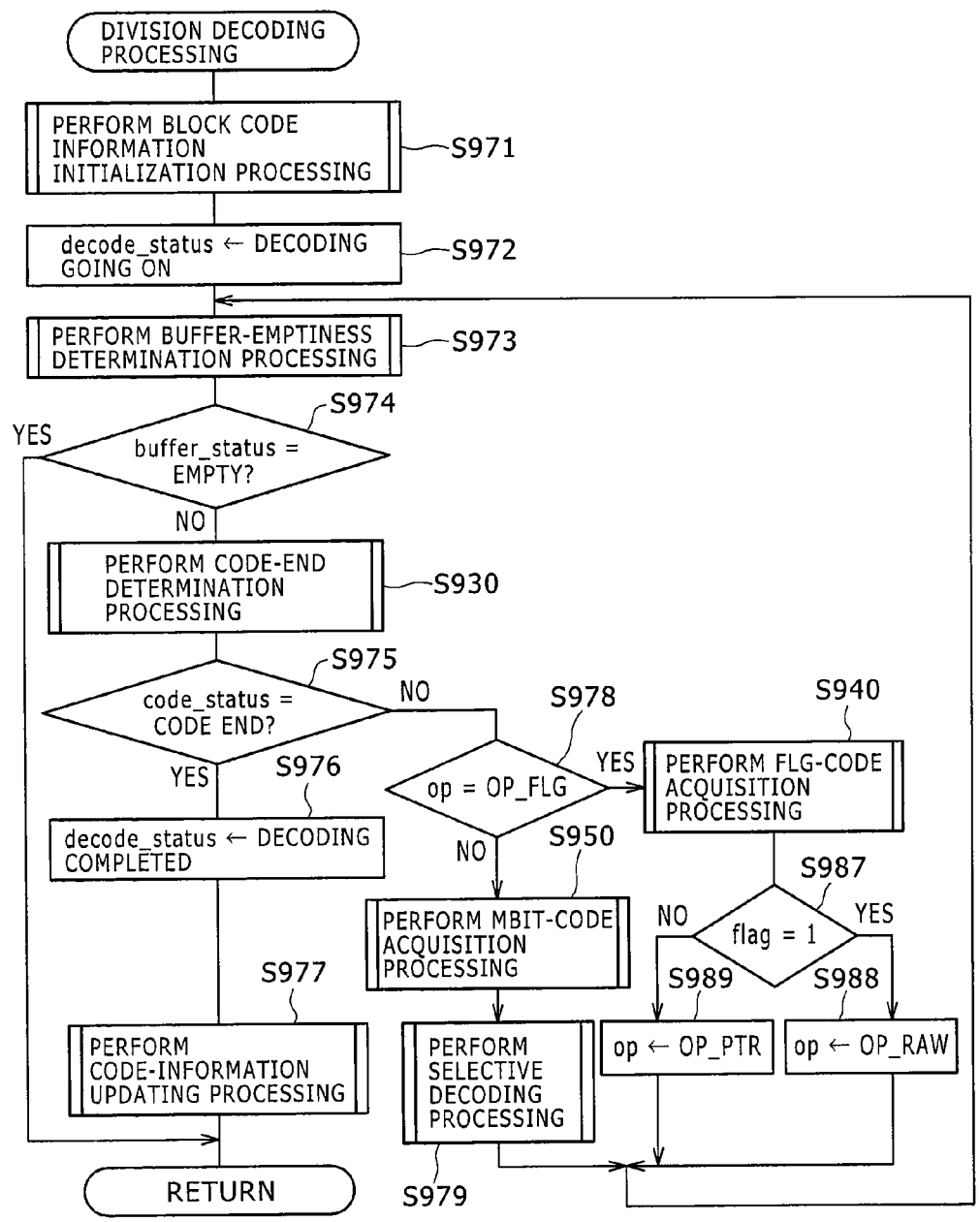
FIG. 34 shows a flowchart representing the procedure of the division decoding processing carried out in accordance with an embodiment.

FIG. 34 shows a flowchart representing the procedure of division decoding processing carried out in accordance with an embodiment of the present invention. The division decoding processing carried out at the step S970 of the flowchart shown in FIG. 32 as a flowchart representing the main stream of the division decoding processing.

The flowchart shown in FIG. 34 begins with a step S971 at which information on block codes is carried out. Then, in a process carried out at the next step S972, a variable decode_status used for holding status of decoding is set at a value indicating that a decoding process is going on. Subsequently, in processes carried out at steps S973 and S974, the code buffer 210 is examined in order to produce a result of determination as to whether or not the code buffer 210 is empty. Then, the following processes are carried out repeatedly as long as the determination result produced in the process carried out at the step S974 indicates that the code buffer 210 is not empty and as long as a determination result produced in a process carried out at a step S975 following a step S930 indicates that the processing to decode all codes has not been completed.

If a determination result produced in a process carried out at a step S975 indicates that the processing to decode all codes has not been completed, the flow of the processing goes on to a step S978. If a determination result produced in a process carried out at the step S978 indicates that the value OP_FLG has been set in the variable op, the flow of the processing goes on to a step S940 at which the FLG-code acquisition processing is carried out. Then, in a process carried out at the next step S987, the variable flag is examined in order to produce a result of determination as to whether or not the variable flag has been set at 1. If the result of the determination indicates that the variable flag has been set at 1, the flow of the processing goes on to a step S988 at which a value OP_RAW is set in the variable op. If the result of the determination indicates that the variable flag has been reset to 0, on the other hand, the flow of the processing goes on to a step S989 at which a value OP_PTR is set in the variable op.

If the determination result produced in the process carried out at the step S978 indicates that a value other than the value OP_FLG has been set in the variable op, on the other hand, the flow of the processing goes on to a step S950 at which processing to acquire a code with a length of M bits is carried out. Then, at the next step S979, selective decoding processing according to the state of the progress of the decoding process is carried out.

If a determination result produced in a process carried out at a step S975 indicates that the processing to decode all codes has been completed, on the other hand, the flow of the processing goes on to a step S976 at which a value indicating the completion of the processing to decode all codes is set in the variable decode_status. Then, in a process carried out at the next step S977, the variable code_count is updated. The variable code_count is code information used for counting the number of encoded codes that have already been decoded.

Figure 35:
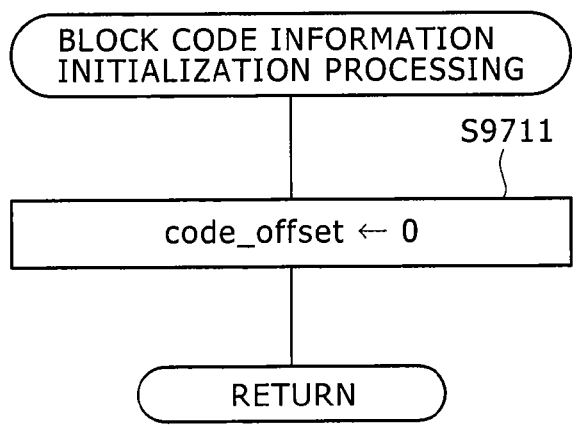
FIG. 35 shows a flowchart representing the procedure of processing carried out in accordance with an embodiment of the present invention to initialize block code information.

FIG. 35 shows a flowchart representing the procedure of processing carried out in accordance with an embodiment of the present invention to initialize block code information. The block code information initialization processing corresponds to the process carried out at the step S971 of the flowchart shown in FIG. 34 as a flowchart representing the division decoding processing. In the block code information initialization processing, a variable code_offset showing the read position in the code buffer 210 is reset to 0 at a step S9711.

Figure 36:
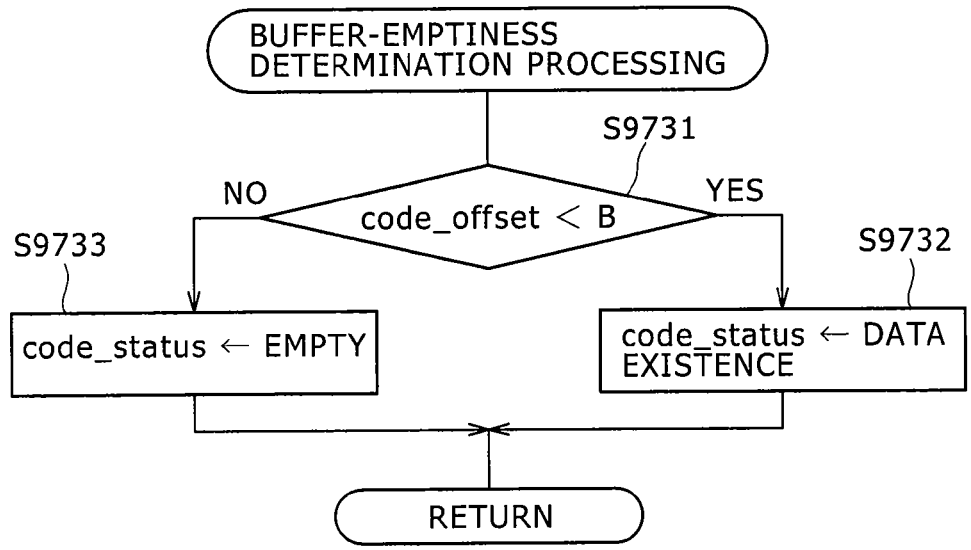
FIG. 36 shows a flowchart representing the procedure of processing carried out in accordance with an embodiment of the present invention to determine emptiness of a code buffer.

FIG. 36 shows a flowchart representing the procedure of processing carried out in accordance with an embodiment of the present invention to determine emptiness of a buffer. The processing to determine emptiness of a buffer corresponds to the process carried out at the step S973 of the flowchart shown in FIG. 34 as a flowchart representing the division decoding processing.

The buffer-emptiness determination processing begins with a step S9731 to produce a result of determination as to whether or not the value of the variable code_offset is smaller than the block size B. If the result of the determination result indicates that the value of the variable code_offset is smaller than the block size B, the flow of the processing goes on to a step S9732 at which a variable code_status is set at a value indicating that data still remains to be decoded. If the result of the determination result indicates that the value of the variable code_offset is at least equal to the block size B, on the other hand, the flow of the processing goes on to a step S9733 at which a variable code_status is set at a value indicating that the code buffer is empty.

Figure 37:
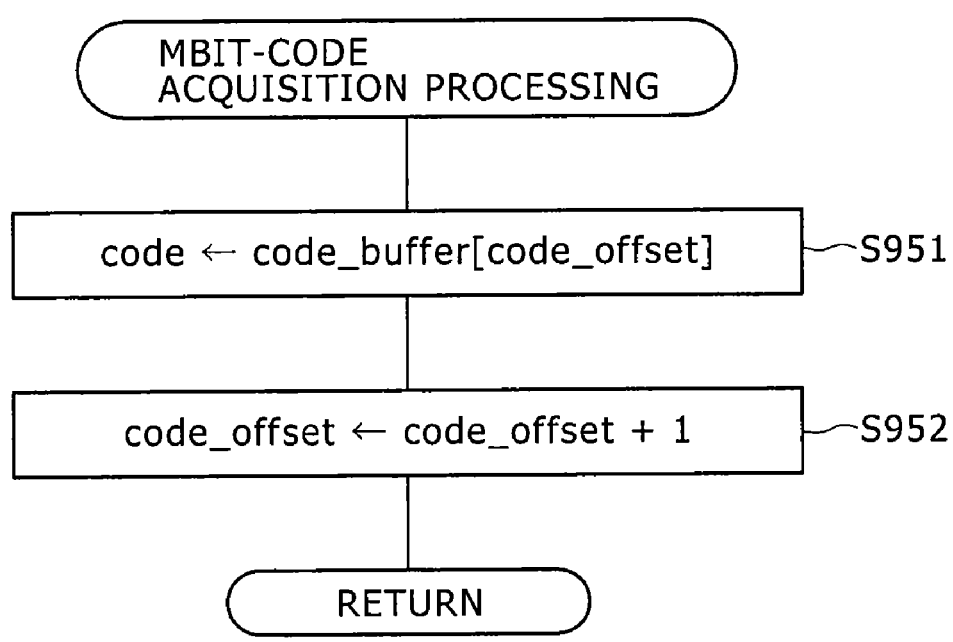
FIG. 37 shows a flowchart representing the procedure of processing carried out to acquire a code with a length of M bits in accordance with an embodiment.

FIG. 37 shows a flowchart representing the procedure of the M bits-code acquisition processing in accordance with an embodiment of the present invention. The processing to acquire a code having a length of M bits corresponds to the process carried out at the step S950 of the flowchart shown in FIG. 34 as a flowchart representing the division decoding processing.

The processing to acquire a code having a length of M bits begins with a step S951 at which the value of a code buffer element code_buffer [code_offset] pointed to by the variable code_buffer is set in a variable code. Then, in a process carried out at the next step S952, the variable code_offset is incremented by 1.

FIG. 38 shows flowcharts representing the procedure of selective decoding processing in accordance with an embodiment of the present invention. The selective decoding processing corresponds to the process at the step S979 in FIG. 34 as a flowchart representing the division decoding processing.

The selective decoding processing may be carried out for M=8 and M=16. The selective decoding processing is carried out for M=8 in a way different from the PTR-code acquisition processing carried out for M=16 as follows. The PTR code consisting of two or one characters in dependence on the value of M. In the case of a PTR code consisting of 2 characters, the code acquisition and decoding processing is divided into 2 processes using 2 values, i.e., OP_PTR and OP_PTR2. In the case of a PTR code consisting of one character, on the other hand, the code acquisition and decoding processing is carried out by using only the value OP_PTR.

Figure 38A:
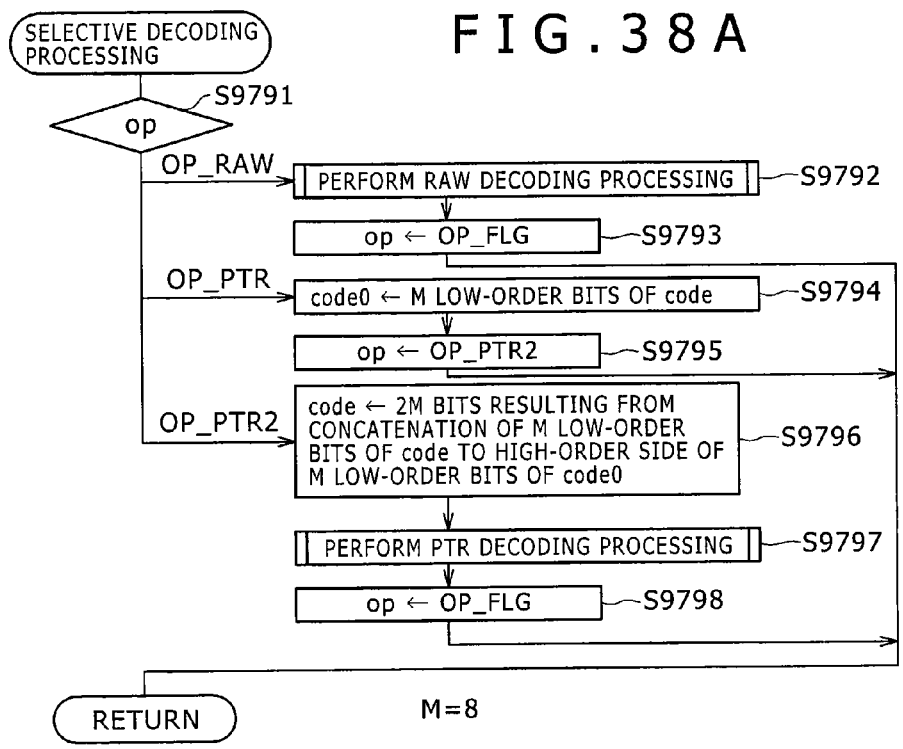
FIGS. 38A and 38B show flowcharts each representing the procedure of selective decoding processing carried out in accordance with an embodiment.

The flowchart shown in FIG. 38A as a flowchart representing the selective decoding processing for M=8 begins with a step S9791 at which the value of the variable op is examined. If the value of the variable is the value OP_RAW, the flow of the processing goes on to a step S9792 at which RAW decoding processing is carried out. Then, in a process carried out at the next step S9793, the value OP_FLG is set in the variable op. If the value of the variable is found to be the value OP_PTR in the process carried out at the step S9791, the flow of the processing goes on to a step S9794 at which M low-order bits of a variable code are set in a variable code 0. Then, in a process carried out at the next step S9795, the value OP_PTR2 is set in the variable op. If the value of the variable is found to be the value OP_PTR2 in the process carried out at the step S9791, the flow of the processing goes on to a step S9796 at which 2M bits obtained as a result of concatenating of the M low-order bits of the variable code to the high-order side of the M low-order bits of the variable code 0 are set the variable code. Subsequently, in a process carried out at the next step S9797, PTR decoding processing is carried out. Then, in a process carried out at the next step S9798, the value OP_FLG is set in the variable op.

Figure 38B:
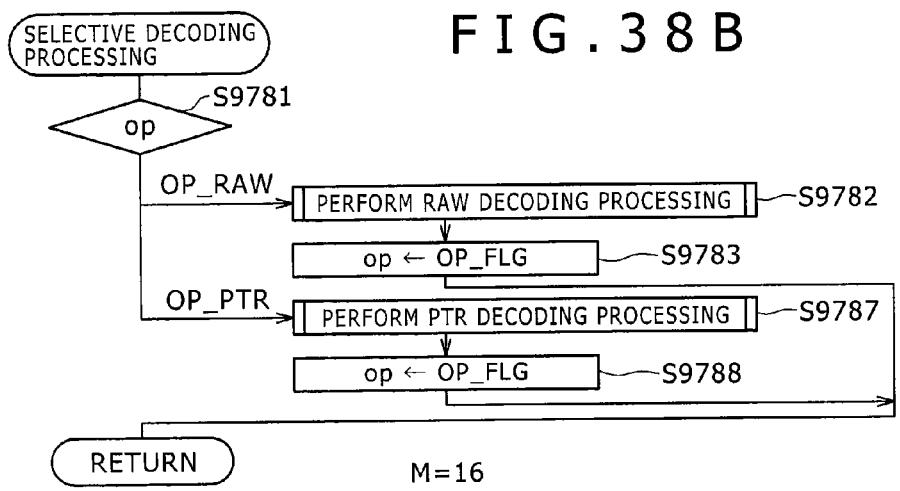

On the other hand, the flowchart shown in FIG. 38B as a flowchart representing the selective decoding processing for M=16 begins with a step S9781 at which the value of the variable op is examined. If the value of the variable is the value OP_RAW, the flow of the processing goes on to a step S9782 at which RAW decoding processing is carried out. Then, in a process carried out at the next step S9783, the value OP_FLG is set in the variable op. If the value of the variable is found to be the value OP_PTR in the process carried out at the step S9781, on the other hand, the flow of the processing goes on to a step S9787 at which PTR decoding processing is carried out. Then, in a process carried out at the next step S9788, the value OP_FLG is set in the variable op.

Figure 39:
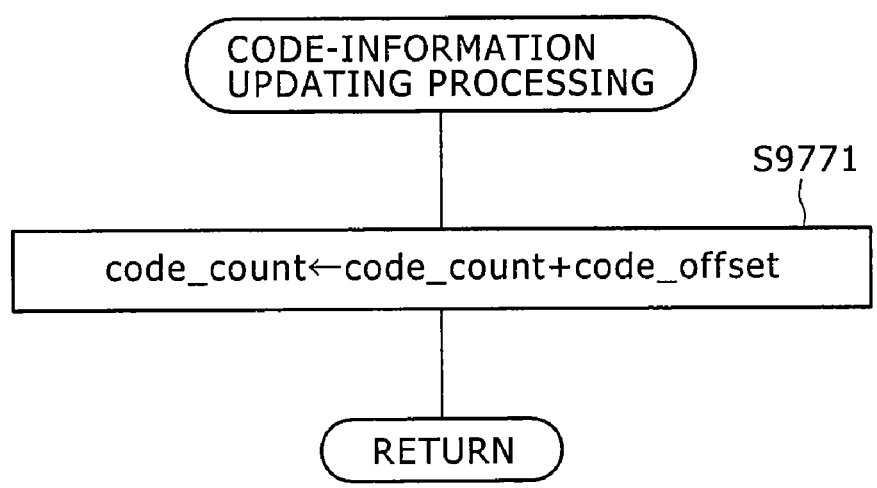
FIG. 39 shows a flowchart each representing the procedure of processing carried out in accordance with an embodiment to update information on codes.

FIG. 39 shows a flowchart representing the procedure of the code-information updating processing in accordance with an embodiment of the present invention. The processing to update the information on codes corresponds to the process carried out at the step S977 in FIG. 34 as a flowchart representing the division decoding processing. In a process carried out at a step S9771, the value of a variable code_offset is added to the value of a variable code_count and stored in the variable code_count. The sum stored in the variable code_count as a sum obtained as a result of the addition represents the number of coded characters that have already been decoded.

As described above, a string of codes is divided into blocks each consisting of B characters and decoded in block units. It is to be noted that a plurality of code buffers may be provided and properly selected as buffers for storing codes. In this case, while a code stored in a code buffer is being decoded, another code can be stored in the next code buffer.

The following description explains concrete typical compression rates achieved in coding processes according to embodiments of the present invention.

FIG. 40 is a table showing compression rates of a substring of characters as compression rates achieved by an embodiment. For each contents of CODE codes, there are 2 types of compression rate for a sub-string of characters. In the case of one of the types, the compression rates are rates for M=8 meaning 8 bits per character and for PTH=2 meaning that a matching length of 3 is assigned to a matching-length code of 0. In the case of the other type, on the other hand, the compression rates are rates for M=16 meaning 16 bits per character and for PTH=1 meaning that a matching length of 2 is assigned to a matching-length code of 0.

An FLG sub-code with a length of 1 bit is combined with a CODE code with a length of a plurality of bits to form the code length of a sub-string of characters. Since a compression rate is defined as a quotient obtained as a result of dividing the code length by the length of the original character sub-string, the smaller the compression rate, the better the efficiency of the compression rate. In accordance with the conventional method, the expression (matching length−PTH−1) can be realized as CODE values of up to 15. Thus, the best compression rate is 11.81% for M=8 and 6.25% for M=16.

In order to solve this problem, the embodiment increases the matching length. As a result, the best compression rate is improved to be smaller, being reduced to 0.12% for M=8 and 0.06% for M=16. If a character string with a large matching length does not exist from the beginning, however, the low compression rates are not applicable. Thus, it is necessary to have input data in which a character string with a large matching length exists.

A program includes instruction codes and data such as initial values of variables. In general, a program is stored in a memory in such a way that the instruction codes and the data can be managed with ease. In a normal case, the data is stored at locations immediately following the storage locations of the instruction codes. Since an instruction code is recognized as a short sub-string of characters, the appearance frequency of short maximum matching character sub-strings is expected to have a large value. In addition, instruction codes are generated by a compiler such as the compiler for the C language in the form of a template to a certain degree and an approximated process is generated as an approximated instruction code. Therefore, in similar functions, instruction codes almost remain unchanged. In such a case, it can be expected that the instruction codes are disassembled into long matching strings of characters.

In addition, in the case of the data cited above, the initial values of numerous variables are 0. Thus, the data can be disassembled into relatively long matching strings of characters in many cases. In the case of such a program having such characteristics, it can be expected that the compression rate is improved by application of the code assignment technique provided by the present invention.

FIG. 41 is a diagram showing a typical distribution of maximum matching lengths of character sub-strings in an embodiment of the present invention. It is assumed that a program can be disassembled even for a relative position NP of 12 bits, a matching-length code NC of 11 bits, a character size M of 8 bits, a threshold value PTH of 2 and a matching length of 2,000 characters. In this case, a certain program was disassembled by adoption of the LZSS method into sub-strings of characters and the maximum matching lengths of the character sub-strings are plotted sequentially to produce the distribution. That is to say, the horizontal axis represents the appearance order of the character sub-strings composing the program and the vertical axis represents the maximum matching lengths of the character sub-strings.

The program having a size of 189,520 bytes was disassembled into 52,590 sub-strings of characters. Even though most of the character sub-strings has a matching length not exceeding 20 characters, it is obvious that some sub-strings of characters each have a maximum matching length greater than 100 characters. In particular, it is obvious that maximum data lengths are seen in a data area placed in the last portion of the program.

When a program is coded at M=8, PTH=2, NC=4 and NP=12, the compression rate according to the conventional LZSS method is 46.20%, but the compression rate according to the present invention is 43.78%. In a program that can be disassembled into character sub-strings having a large maximum matching length as described above, improvement of the compression rate can be implemented. In particular, in the case of a program having a large number of repetitions of simple data, improvement of the compression rate by at least 20% can be expected.

It is to be noted that, as typical bit counts of the explained codes, an NC of 4 and an NP of 12 have been selected. Thus, the PTR code has a length of 16 bits. The FLG sub-codes are packed in M-bit units where notation M denotes the integer 8 or 16. The RAW code is the original character remaining unchanged as it is. The RAW code also has a length of 8 or 16 bits. By setting bit counts of all codes at a multiple of 8 in this way, unnecessary bit operations are not required. Thus, the technique provided by this embodiment is suitable for processing such as software processing. In the embodiments, only assignment of matching lengths to matching-length codes c is changed with NC=4 kept as it is. Thus, not only can a program be disassembled into character sub-strings each having a large maximum matching length, the resulting codes can also be processed in units each having a length equal to a multiple of a bit count of 8. As a result, the software processing can be carried out at a high speed.

Figure 42:
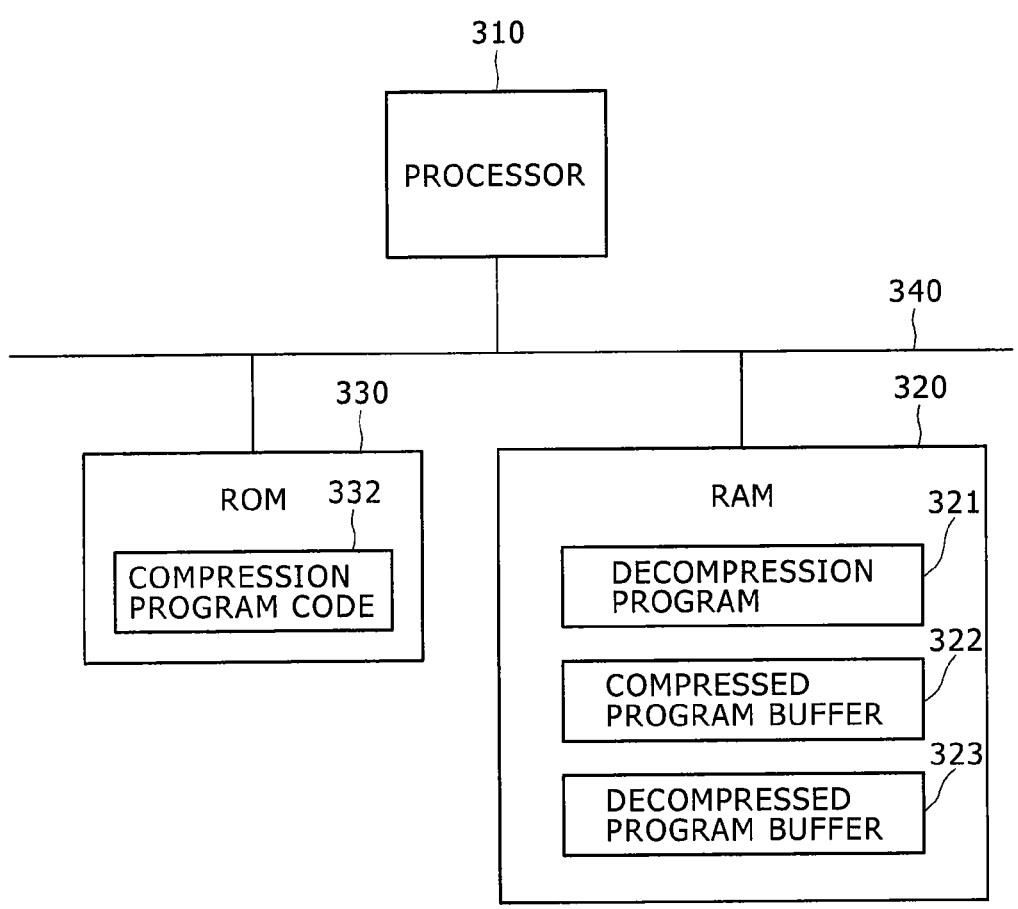
FIG. 42 is a block diagram showing typical application of an embodiment to processing carried out by a computer system to decompress a program.
Figure 43A:
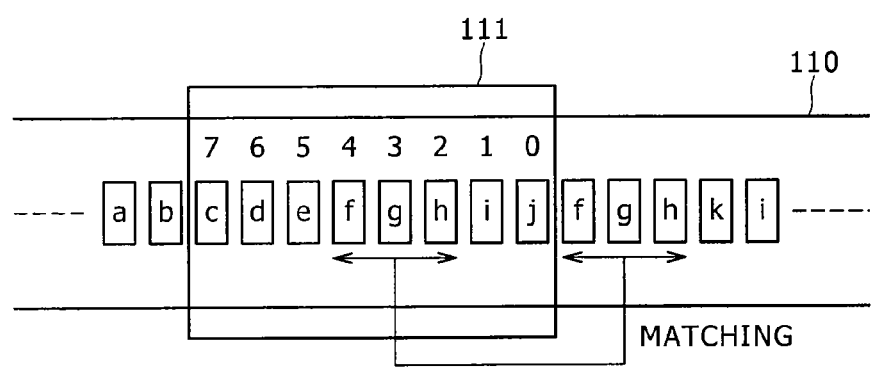
FIGS. 43A and 43B are diagrams each showing a typical LZSS-code encoding process.
Figure 43B:
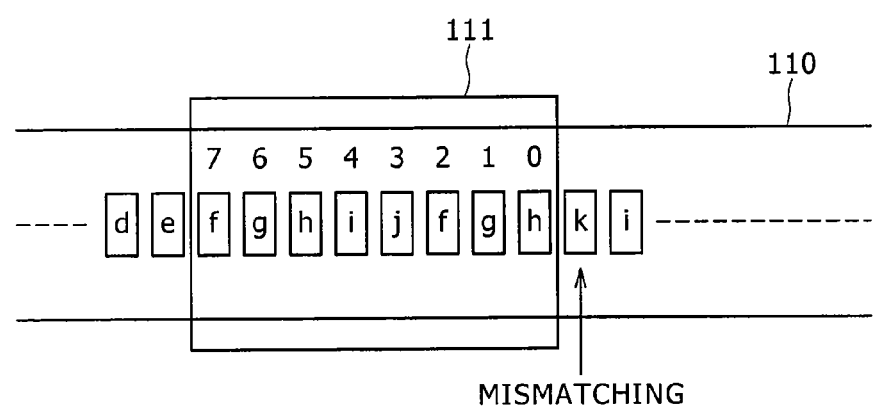

FIG. 42 is a block diagram showing a typical application of an embodiment to processing carried out by a computer system to decompress a program. The computer system is assumed to have a processor 310, a RAM 320 and a ROM 330, which are connected to each other by a system bus 340.

The processor 310 is a section for executing a program by using the RAM 320 as a work area. In many cases, the computer system employs an SRAM having a high speed and a large storage capacity as the RAM 320. On the other hand, the computer system generally employs a memory such as a flash memory with a relatively small storage capacity as the ROM 330.

Let us assume that the ROM 330 is used for storing a compressed program as compressed-program code 332. In the following description, the compressed program is referred to as program A. The compressed-program code 332 is once transferred to a compressed-program buffer 322 included in the RAM 320. The RAM 320 is also used for storing in advance a program for decompressing program A. Referred to as program X, the program for decompressing program A is shown in the figure as a decompression processing program 321. The processor 310 executes program X in order to decompress program A stored in the compressed-program buffer 322 and stores a decompressed program obtained as a result of the decompression in a decompressed-program buffer 323.

The decompression processing provided by the embodiments can be applied to the decompression processing according to the decompression processing program 321. That is to say, by using the compressed-program buffer 322 for holding program A encoded in accordance with the embodiment as the code buffer 210 and using the decompressed-program buffer 323 as the decoding buffer 280, program A can be decompressed by execution of the decompression processing program 321 referred to as program X for implementing a decoding method according to the embodiment.

As described above, in an apparatus activated by execution of a program stored in an external memory such as a flash memory in advance and then transferred to an internal memory having a high speed, an operation to read out the program from the external memory has a dominant effect on an activation time. In order to solve the problem of the affected activation time, the program is stored in the external memory beforehand in a compressed state and decompressed after being transferred to the internal memory. In this way, the processing can be carried out at a higher speed. Since the time it takes to compress the original program is generally longer than the time it takes to decompress the compressed program, as a whole, a shortened activation time that includes only the time it takes to carry out the decompression processing can be expected. In addition, also in an apparatus activated by execution of a program transferred from an external source by way of a network, the transfer time can be shortened by compressing the program before being transferred. Thus, the activation time can be shortened as well in the same way.

As explained above, in accordance with the embodiments, the matching-length coding section 160 refers to the matching-length extension table 150 in order to dynamically determine a relation between a matching length and a matching-length code in accordance with an internal state stored in the internal-state holding section 140. By the same token, the matching-length decoding section 260 refers to the matching-length extension table 250 in order to dynamically determine a relation between a matching length and a matching-length code in accordance with an internal state stored in the internal-state holding section 240. In this way, the matching length that can be expressed by the matching-length code can be switched independently from one value to another.

It is to be noted that the embodiments are each for implementing the present invention. Thus, invention elements described in claims correspond to their respective elements of the embodiments. However, it should be appreciated that the scope of the present invention is not limited to the embodiments.

For example, a character-string search section, an internal-state holding section, a matching-length coding section and a symbol-string coding section, which are described in claim 1, typically correspond to the character-string searching section 130, the internal-state holding section 140, the matching-length coding section 160 and the character-string coding section 170 respectively.

A matching-length extension section described in claim 4 typically corresponds to the matching-length extension table 150.

A decoding buffer, a code acquisition section, an internal-state holding section, a matching-length decoding section and a symbol-string decoding section, which are described in claim 5, typically correspond to the decoding buffer 280, the code acquisition section 230, the internal-state holding section 240, the matching-length decoding section 260 and the character-string decoding section 270 respectively.

A matching-length extension section described in claim 8 typically corresponds to the matching-length extension table 250.

A code-buffer control section described in claim 9 typically corresponds to the code-buffer control section 220.

A decompressed program buffer, a compressed program buffer, a code acquisition section, an internal-state holding section, a matching-length decoding section and a symbol-string decoding section, which are described in claim 10, typically correspond to the decompressed-program buffer 323, the compressed-program buffer 322, the code acquisition section 230, the internal-state holding section 240, the matching-length decoding section 260 and the character-string decoding section 270 respectively.

Invention elements described in claim 11 or 13 correspond to their respective elements of embodiments as follows. A procedure for searching a predetermined search range in a data buffer used for holding input data for matching a symbol sub-string serving as a coding object of the input data typically corresponds to the step S730. A procedure for assigning a matching-length code to the matching length of a symbol sub-string found in a search process as a symbol sub-string serving as a coding object of input data in accordance with a predetermined internal state typically corresponds to the steps S7511 to S7517. A procedure for updating an internal state in accordance with the matching length typically corresponds to the steps S7521 to S7525. A procedure for coding a sub-string of symbols on the basis of a relative address in a data buffer of the sub-string of symbols and on the basis of a matching-length code typically corresponds to the step S757.

Invention elements described in claim 12 or 14 correspond to their respective elements of embodiments as follows. A procedure for acquiring a symbol sub-string including a relative address in the symbol sub-string and including a matching-length code typically corresponds to the step S880. A procedure for decoding a matching-length code representing the length of a sub-string of symbols into a matching length in accordance with a predetermined internal state typically corresponds to the steps S8931 to S8935. A procedure for updating an internal state in accordance with a matching length obtained as a result of a decoding process typically corresponds to the steps S8941 to S8945. A procedure for decoding a symbol sub-string corresponding to a symbol sub-string code by referring to a decoding buffer on the basis of a relative address in the symbol sub-string and on the basis of a matching length typically corresponds to the step S895.

It is to be noted that processing procedures explained in description of an embodiment of the present invention can be interpreted as a method including a series of such procedures. As an alternative, such processing procedures can be interpreted as a program executed by a computer to implement a series of such procedures and a recording medium used for storing the program.

In addition, it should be understood by those skilled in the art that a variety of modifications, combinations, sub-combinations and alterations may occur in dependence on design requirements and other factors insofar as they are within the scope of the appended claims or the equivalents thereof.

The invention is claimed as follows:

1. A coding apparatus comprising:
    symbol-string searching means for searching a predetermined search range of a data buffer used for holding input data for a state of matching a symbol sub-string serving as a coding object of said input data;
    internal-state holding means used for holding a predetermined internal state;
    matching-length coding means for assigning a matching-length code to a matching length representing the length of said symbol sub-string in a matching state detected by said symbol-string searching means as a result of a search process in an assignment process according to an internal state held by said internal-state holding means and then updating said internal state held by said internal-state holding means in accordance with said matching length; and symbol-string coding means for coding said symbol sub-string on the basis of the position of said symbol sub-string in a matching state detected by said symbol-string searching means as a result of a search process and on the basis of said matching-length code assigned by said matching-length coding means, wherein said matching-length coding means:

resets an internal state held by said internal-state holding means to a lowest stage if said matching-length code is smaller than a predetermined threshold value;

drives an internal state held by said internal-state holding means to transit to a higher stage if said matching-length code is equal to a maximum value; or drives an internal state held by said internal-state holding means to transit to a lower stage if said matching-length code is at least equal to said predetermined threshold value but smaller than said maximum value.

2. A coding apparatus comprising:

symbol-string searching means for searching a predetermined search range of a data buffer used for holding input data for a state of matching a symbol sub-string serving as a coding object of said input data;

internal-state holding means used for holding a predetermined internal state;

matching-length coding means for assigning a matching-length code to a matching length representing the length of said symbol sub-string in a matching state detected by said symbol-string searching means as a result of a search process in an assignment process according to an internal state held by said internal-state holding means and then updating said internal state held by said internal-state holding means in accordance with said matching length; and symbol-string coding means for coding said symbol sub-string on the basis of the position of said symbol sub-string in a matching state detected by said symbol-string searching means as a result of a search process and on the basis of said matching-length code assigned by said matching-length coding means, wherein said matching-length coding means:

assigns a code determined for a matching length as said matching-length code to said matching length in an assignment process independent of an internal state held by said internal-state holding means if said matching-length code is smaller than a predetermined threshold value; or assigns a code determined for a matching length as said matching-length code to said matching length in an assignment process dependent on an internal state held by said internal-state holding means and dependent on said matching length if said matching-length code is equal to or greater than said predetermined threshold value.

3. A coding apparatus comprising:

symbol-string searching means for searching a predetermined search range of a data buffer used for holding input data for a state of matching a symbol sub-string serving as a coding object of said input data;

internal-state holding means used for holding a predetermined internal state;

matching-length coding means for assigning a matching-length code to a matching length representing the length of said symbol sub-string in a matching state detected by said symbol-string searching means as a result of a search process in an assignment process according to an internal state held by said internal-state holding means and then updating said internal state held by said internal-state holding means in accordance with said matching length; and symbol-string coding means for coding said symbol sub-string on the basis of the position of said symbol sub-string in a matching state detected by said symbol-string searching means as a result of a search process and on the basis of said matching-length code assigned by said matching-length coding means, said coding apparatus further having matching-length extension means for setting a relation between a matching length and a matching-length code to be assigned to said matching length as a relation according to an internal state held by said internal-state holding means, wherein said matching-length coding means:

assigns a code determined for a matching length as said matching-length code to said matching length in an assignment process independent of an internal state held by said internal-state holding means if said matching-length code is smaller than a predetermined threshold value; or assigns a code determined by said matching-length extension means for a matching length to said matching length as said matching-length code if said matching-length code is equal to or greater than said predetermined threshold value.

4. A decoding apparatus comprising:

a decoding buffer used for holding a symbol sub-string obtained as a result of a process to decode a code string;

a code buffer used for holding said code string to be decoded;

code acquisition means for acquiring symbol sub-string codes including the position of said symbol sub-string and including a matching-length code of said symbol sub-string from said code buffer;

internal-state holding means used for holding a predetermined internal state;

matching-length decoding means for decoding said matching-length code to generate a matching length represented by said matching-length code as a matching length representing the length of said symbol sub-string in a decoding process according to an internal state held by said internal-state holding means and then updating said internal state held by said internal-state holding means in accordance with said matching length; and symbol-string decoding means for decoding said symbol sub-string codes to generate said symbol sub-string represented by said symbol sub-string codes by referring to said decoding buffer in a decoding process according to said position of said symbol sub-string and according to said matching-length code of said symbol sub-string.

5. The decoding apparatus according to claim 4, wherein said matching-length decoding means:

resets an internal state held by said internal-state holding means to a lowest stage if said matching-length code is smaller than a predetermined threshold value;

drives an internal state held by said internal-state holding means to transit to a higher stage if said matching-length code is equal to a maximum value; or drives an internal state held by said internal-state holding means to transit to a lower stage if said matching-length code is at least equal to said predetermined threshold value but smaller than said maximum value.

6. The decoding apparatus according to claim 4, wherein said matching-length decoding means:
   decodes a matching-length code to generate a matching length determined for said matching-length code as the length of a symbol sub-string in a decoding process independent of an internal state held by said internal-state holding means if said matching-length code is smaller than a predetermined threshold value; or
   decodes a matching-length code to generate a matching length determined for said matching-length code as the length of a symbol sub-string in a decoding process according to an internal state held by said internal-state holding means and according to said matching-length code if said matching-length code is equal to or greater than said predetermined threshold value.

7. The decoding apparatus according to claim 4, said decoding apparatus further having matching-length extension means for setting a relation between a matching-length code and a matching length obtained as a result of a process to decode said matching-length code as a relation according to an internal state held by said internal-state holding means, wherein said matching-length decoding means:
   decodes a matching-length code to generate a matching length determined for said matching-length code as the length of a symbol sub-string in a decoding process independent of an internal state held by said internal-state holding means if said matching-length code is smaller than a predetermined threshold value; or
   decodes a matching-length code to generate a matching length determined by said matching-length extension means for said matching-length code if said matching-length code is equal to or greater than said predetermined threshold value.

8. The decoding apparatus according to claim 4, wherein said decoding apparatus further includes code-buffer control means for executing control to supply said code string to said code buffer in block units, wherein said matching-length decoding means stores information on a process to be carried out next in advance in storage means each time one of said block units is decoded and, then, the next one of said block units is decoded in accordance with said stored information on said process to be carried out next.

9. A compressed-program decompression apparatus comprising:
   a decompressed-program buffer used for holding a symbol sub-string obtained as a result of a process to decompress a compressed program embodied on a computer-readable media;
   a compressed-program buffer used for holding said compressed program to be decompressed;
   code acquisition means for acquiring symbol sub-string codes including the position of said symbol sub-string and including a matching-length code of said symbol sub-string from said compressed-program buffer;
   internal-state holding means used for holding a predetermined internal state;
   matching-length decoding means for decoding said matching-length code to generate a matching length representing the length of said symbol sub-string in a decoding process according to an internal state held by said internal-state holding means and then updating said internal state held by said internal-state holding means in accordance with said matching length; and
   symbol-string decoding means for decoding said symbol sub-string codes to generate said symbol sub-string represented by said symbol sub-string codes by referring to said decompressed-program buffer in a decoding process according to said position of said symbol sub-string and according to said matching-length code of said symbol sub-string.

10. A method of decoding a code string held in a code buffer in a code decoding process and storing a symbol sub-string obtained as a result of said code decoding process in a decoding buffer, said decoding method comprising:
    acquiring symbol sub-string codes including a relative address of said symbol sub-string and including a matching-length code of said symbol sub-string from said code buffer;
    decoding said matching-length code to generate a matching length representing the length of said symbol sub-string in a length decoding process according to a predetermined internal state;
    updating said internal state in accordance with said matching length obtained as a result of said length decoding process; and
    decoding said symbol sub-string codes to generate said symbol sub-string represented by said symbol sub-string codes by referring to said decoding buffer in a string decoding process according to said relative address of said symbol sub-string and according to said matching-length code of said symbol sub-string.

11. A computer program embodied in a computer-readable media for decoding a code string held in a code buffer in a code decoding process and storing a symbol sub-string obtained as a result of said code decoding process in a decoding buffer, said computer program comprising:
    acquiring symbol sub-string codes including a relative address of said symbol sub-string and including a matching-length code of said symbol sub-string from said code buffer;
    decoding said matching-length code to generate a matching length representing the length of said symbol sub-string in a length decoding process according to a predetermined internal state;
    updating said internal state in accordance with said matching length obtained as a result of said length decoding process; and
    decoding said symbol sub-string codes to generate said symbol sub-string represented by said symbol sub-string codes by referring to said decoding buffer in a string decoding process according to said relative address of said symbol sub-string and according to said matching-length code of said symbol sub-string.

* * * * *